(12) United States Patent
Bonora

(10) Patent No.: US 9,275,885 B2
(45) Date of Patent: Mar. 1, 2016

(54) HORIZONTAL DISPLACEMENT MECHANISM FOR CLEANROOM MATERIAL TRANSFER SYSTEMS

(75) Inventor: Anthony C. Bonora, Portola Valley, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 922 days.

(21) Appl. No.: 13/457,278

(22) Filed: Apr. 26, 2012

(65) Prior Publication Data

US 2012/0301260 A1    Nov. 29, 2012

Related U.S. Application Data

(60) Provisional application No. 61/481,062, filed on Apr. 29, 2011.

(51) Int. Cl.
*H01L 21/677* (2006.01)
*F16H 25/18* (2006.01)

(52) U.S. Cl.
CPC ........ *H01L 21/67775* (2013.01); *F16H 25/186* (2013.01); *H01L 21/6773* (2013.01); *Y10T 29/49826* (2015.01); *Y10T 74/18312* (2015.01)

(58) Field of Classification Search
CPC .................................................. F16H 25/186
See application file for complete search history.

(56) References Cited

U.S. PATENT DOCUMENTS

| 3,454,169 | A | * | 7/1969 | Bridges | ...................... B25J 9/04 37/307 |
| 3,596,525 | A | * | 8/1971 | Niesz | ................... B23D 49/162 173/DIG. 1 |
| 7,771,151 | B2 | | 8/2010 | Bonora et al. | |

OTHER PUBLICATIONS

International Search Report and Written Opinion for PCT/US2012/035639, mailed Sep. 24, 2012.

* cited by examiner

*Primary Examiner* — Scott Lowe
(74) *Attorney, Agent, or Firm* — Martine Penilla Group, LLP

(57) ABSTRACT

A spiral cam has a tubular shaped portion defined by an interior cavity and an exterior surface that includes a cam contour. A linear slide assembly having a length defined along a rotational axis is defined to slide lengthwise into the interior cavity of the spiral cam. The linear slide assembly allows for movement of the spiral cam along the rotational axis and prevents rotation of the spiral cam relative to the linear slide assembly. A cam roller is fixed at a position proximate to the exterior surface of the spiral cam. The cam roller is disposed separate from the linear slide assembly and within the cam contour of the spiral cam. The cam roller engages the cam contour to move of the spiral cam along the rotational axis when the linear slide assembly and spiral cam are rotated in unison about the rotational axis relative to the cam roller.

29 Claims, 20 Drawing Sheets

View A-A

HORIZONTAL DISPLACEMENT MECHANISM FOR CLEANROOM MATERIAL TRANSFER SYSTEMS

CLAIM OF PRIORITY

This application claims priority under 35 U.S.C. 119(e) to U.S. Provisional Patent Application No. 61/481,062, filed Apr. 29, 2011, entitled "Horizontal Displacement Mechanism for Cleanroom Transfer Systems," the disclosure of which is incorporated herein by reference.

BACKGROUND

During semiconductor manufacturing, a semiconductor wafer undergoes a plurality of process steps, each of which are performed by a specialized process tool. Pods are used to convey semiconductor wafers from one tool to another. Each pod is capable of transporting a number of wafers of a specific diameter. The pods are designed to maintain a protected internal environment to keep the wafers free of contamination, e.g., by particulates in the air outside the pod. Pods are also known for conveying other types of substrates, such as reticles, liquid crystal panels, rigid magnetic media for hard disk drives, solar cells, etc.

A loadport transfer device is defined to provide a standard mechanical interface to wafer fabrication production tools (process and/or metrology tools) to enable loading/unloading of pods into/out of wafer fabrication production tools, while ensuring protection of wafers therein from contamination. FIG. 1 shows an articulation schematic of a conventional loadport 10 having a window 12 through which a pod 14 is moved, in accordance with the prior art. The conventional loadport 10 is defined to move the pod 14 through the window 12 in a Y direction, and is defined to move the pod 14 in a Z direction. However, the conventional loadport 10 is not capable of moving the pod 14 in the X direction, i.e., in a horizontal direction. It is within this context that the present invention arises.

SUMMARY

In one embodiment, a spiral cam apparatus is disclosed. The spiral cam apparatus includes a spiral cam that has a tubular shaped portion defined by an interior cavity and an exterior surface. The exterior surface of the spiral cam includes a cam contour. The spiral cam apparatus also includes a linear slide assembly that has a length defined along a rotational axis. The linear slide assembly is defined to slide lengthwise into the interior cavity of the spiral cam. The linear slide assembly is defined to allow movement of the spiral cam along the rotational axis and prevent rotation of the spiral cam relative to the linear slide assembly. The spiral cam apparatus further includes a cam roller fixed at a position proximate to the exterior surface of the spiral cam. The cam roller is disposed separate from the linear slide assembly. Also, the cam roller is positioned within the cam contour of the spiral cam. The cam roller is defined to engage with the cam contour of the spiral cam to cause movement of the spiral cam along the rotational axis when the linear slide assembly and spiral cam are rotated in unison about the rotational axis relative to the cam roller.

In another embodiment, a loadport is disclosed. The loadport includes an articulating arm. The loadport also includes a rotatable shaft disposed to extend through and away from the articulating arm. The rotatable shaft is defined to rotate about a first rotational axis. The loadport also includes a linear slide assembly rigidly connected to the rotatable shaft, such that a length of the linear slide assembly extends along the first rotational axis away from the articulating arm. The loadport further includes a spiral cam that has a tubular shaped portion defined by an interior cavity and an exterior surface. The spiral cam is defined to receive the linear slide assembly within the interior cavity. The linear slide assembly is defined to allow movement of the spiral cam along the first rotational axis and prevent rotation of the spiral cam relative to the linear slide assembly, such that both the spiral cam and the linear slide assembly are configured to rotate in unison with rotation of the rotatable shaft. The exterior surface of the spiral cam includes a cam contour. The loadport also includes a cam roller disposed at a fixed position relative to the articulating arm and proximate to the exterior surface of the spiral cam. The cam roller is disposed separate from the linear slide assembly and rotatable shaft. Also, the cam roller is positioned within the cam contour of the spiral cam. The cam roller is defined to engage with the cam contour to cause movement of the spiral cam along the first rotational axis when the spiral cam is rotated relative to the cam roller through rotation of the linear slide assembly by way of the rotatable shaft.

In another embodiment, a method is disclosed for operating a loadport to provide horizontal displacement of an object. The method includes an operation for rigidly connecting a linear slide assembly to a rotatable shaft extending outward from an articulating arm of a loadport. The rotatable shaft has a rotational axis oriented in a horizontal direction. The method also includes an operation for placing a spiral cam that has a tubular shaped portion defined by an interior cavity and an exterior surface over the linear slide assembly, such that the linear slide assembly is received within the interior cavity of the spiral cam. The interior cavity of the spiral cam interfaces with the linear slide assembly such that the spiral cam is freely movable along a length of the linear slide assembly, and such that the spiral cam is prevented from rotating relative to the linear slide assembly. The exterior surface of the spiral cam includes a cam contour. The method further includes an operation for placing a cam roller at a fixed position relative to the articulating arm and proximate to the exterior surface of the spiral cam, such that the cam roller engages with the cam contour of the exterior surface of the spiral cam.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
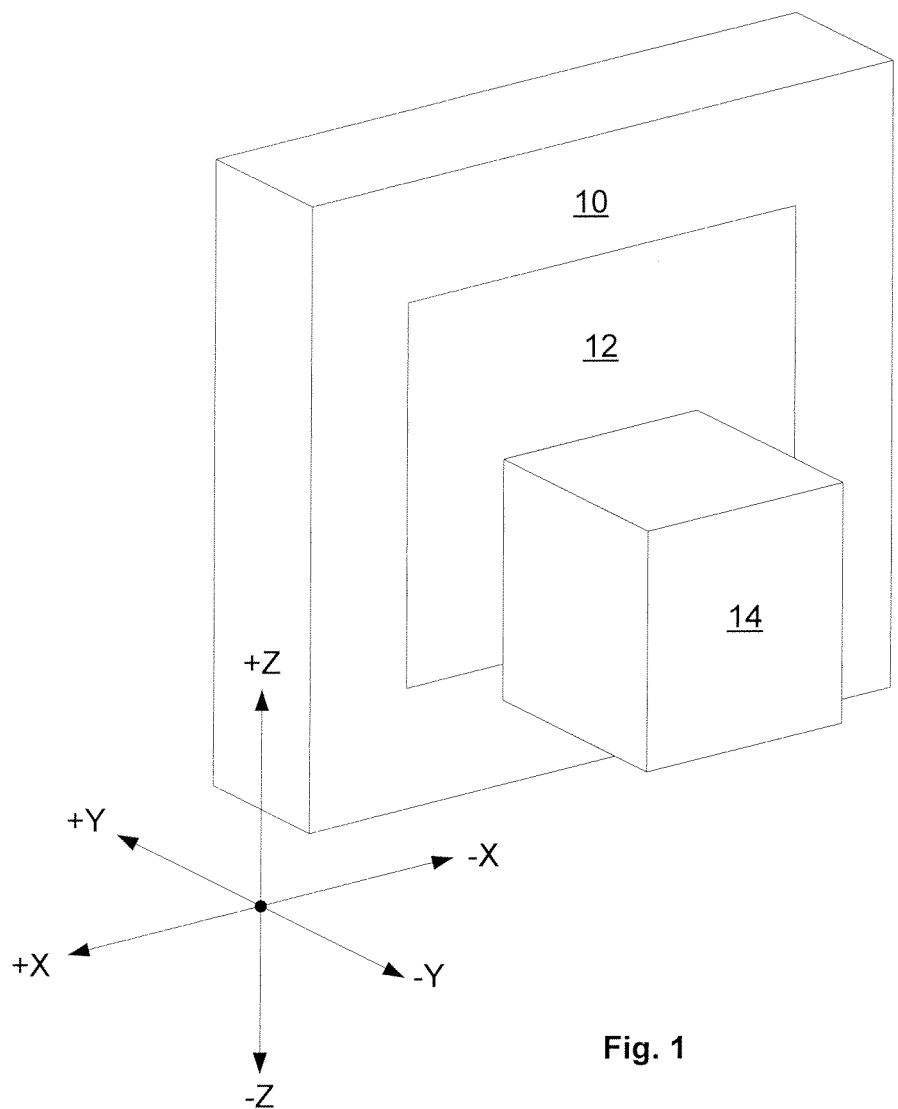
FIG. 1 shows an articulation schematic of a conventional loadport having a window through which a pod is moved, in accordance with the prior art.
Figure 2A:
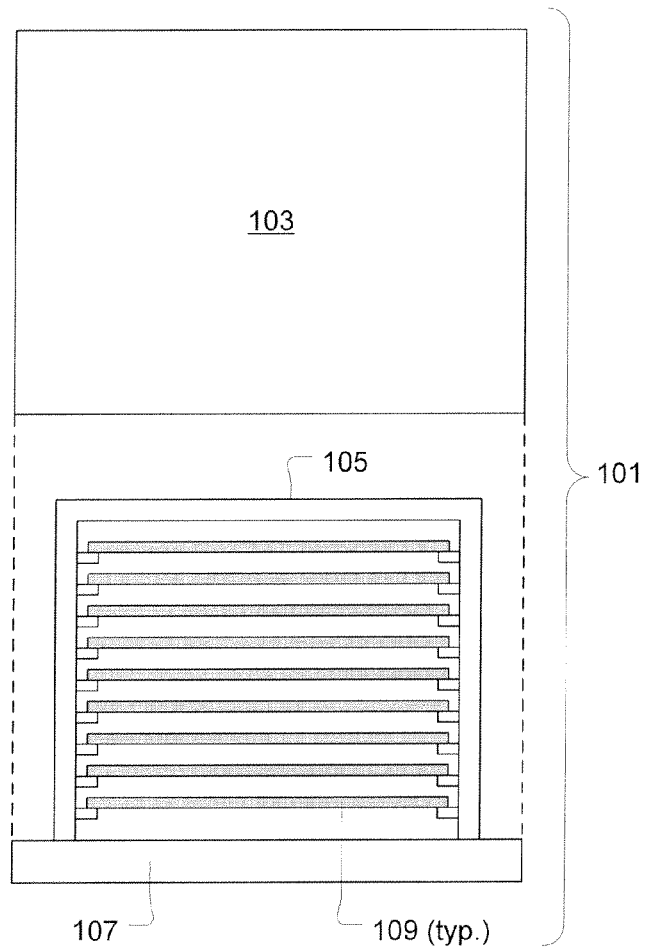
FIG. 2A shows a substrate isolation container in an open state, in accordance with one embodiment of the present invention.
Figure 2B:
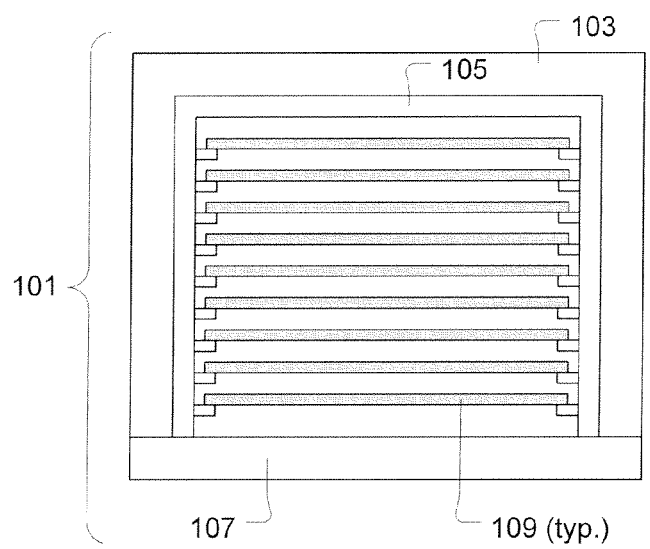
FIG. 2B shows the substrate isolation container in a closed state, in accordance with one embodiment of the present invention.

FIG. 2A shows a substrate isolation container 101 in an open state, in accordance with one embodiment of the present invention. The substrate isolation container 101 is defined to hold a number of substrates 109 in a secure manner while ensuring protection of the substrates 109 from contamination present outside of the substrate isolation container 101. The substrate 109 can represent essentially any type of article formed through the semiconductor fabrication process. For example, the substrate 109 may represent a semiconductor wafer, a flat panel display, a solar panel, among many others. For ease of description, the term substrate is used herein to refer to any type of article to be received into or retrieved from a semiconductor fabrication process tool or metrology tool. In one embodiment, the substrate isolation container 101 is a SMIF pod including a cassette 105 within which the substrates 109 are held, a bottom door 107 to which the cassette 105 is connected, and a shell 103 defined to cover the cassette 105 and connect with the bottom door 107. FIG. 2B shows the substrate isolation container 101 in a closed state, in accordance with one embodiment of the present invention.

In one embodiment, a spiral cam apparatus 400, as disclosed herein, is defined to move the substrate isolation container 101, or portion thereof, through a loadport 200. However, it should be understood that the spiral cam apparatus 400, as disclosed herein, is not limited to use with SMIF pod type substrate isolation containers 101. In other embodiments, the spiral cam 400 apparatus as disclosed herein can be used with essentially any type of substrate isolation container 101, or open cassette 105, or essentially any other type of object that needs to be moved through a loadport within a semiconductor fabrication facility, so long as the object is defined to be external grasped by any type of gripper assembly that can be connected to the spiral cam apparatus 400. For ease of discussion, the spiral cam apparatus 400 is disclosed herein with regard to movement of a cassette 105 through a loadport.

Figure 3A:
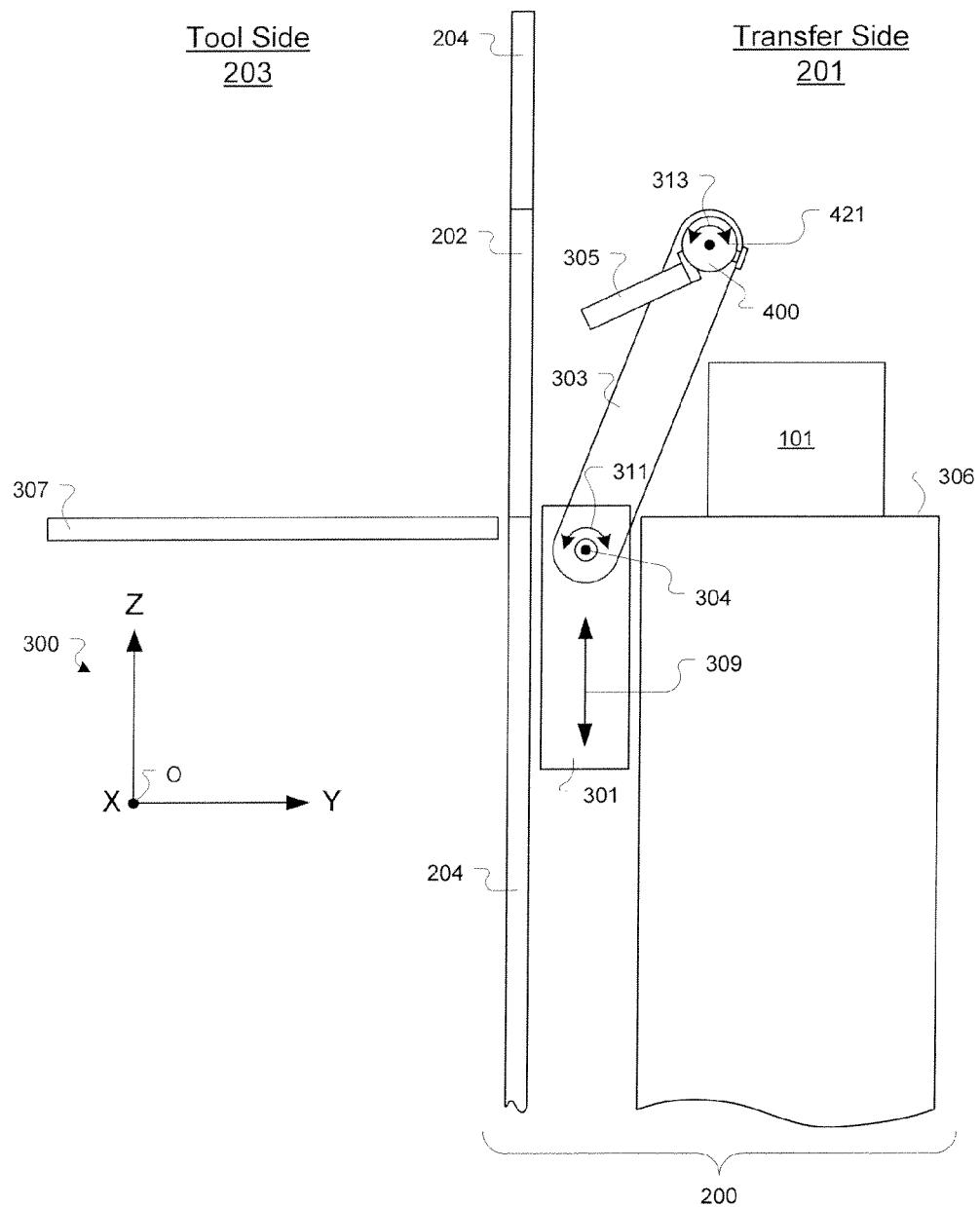
FIG. 3A shows a loadport, in accordance with one embodiment of the present invention.

FIG. 3A shows a loadport 200, in accordance with one embodiment of the present invention. The loadport 200 is defined to provide a standard mechanical interface to wafer fabrication production tools, such as process and/or metrology tools, to enable loading of the cassette 105 from a transfer side 201 of the loadport 200 to a tool side 203 of the loadport 200, and to enable unloading of the cassette 105 from the tool side 203 of the loadport 200 to the transfer side 201 of the loadport 200.

Figure 3B:
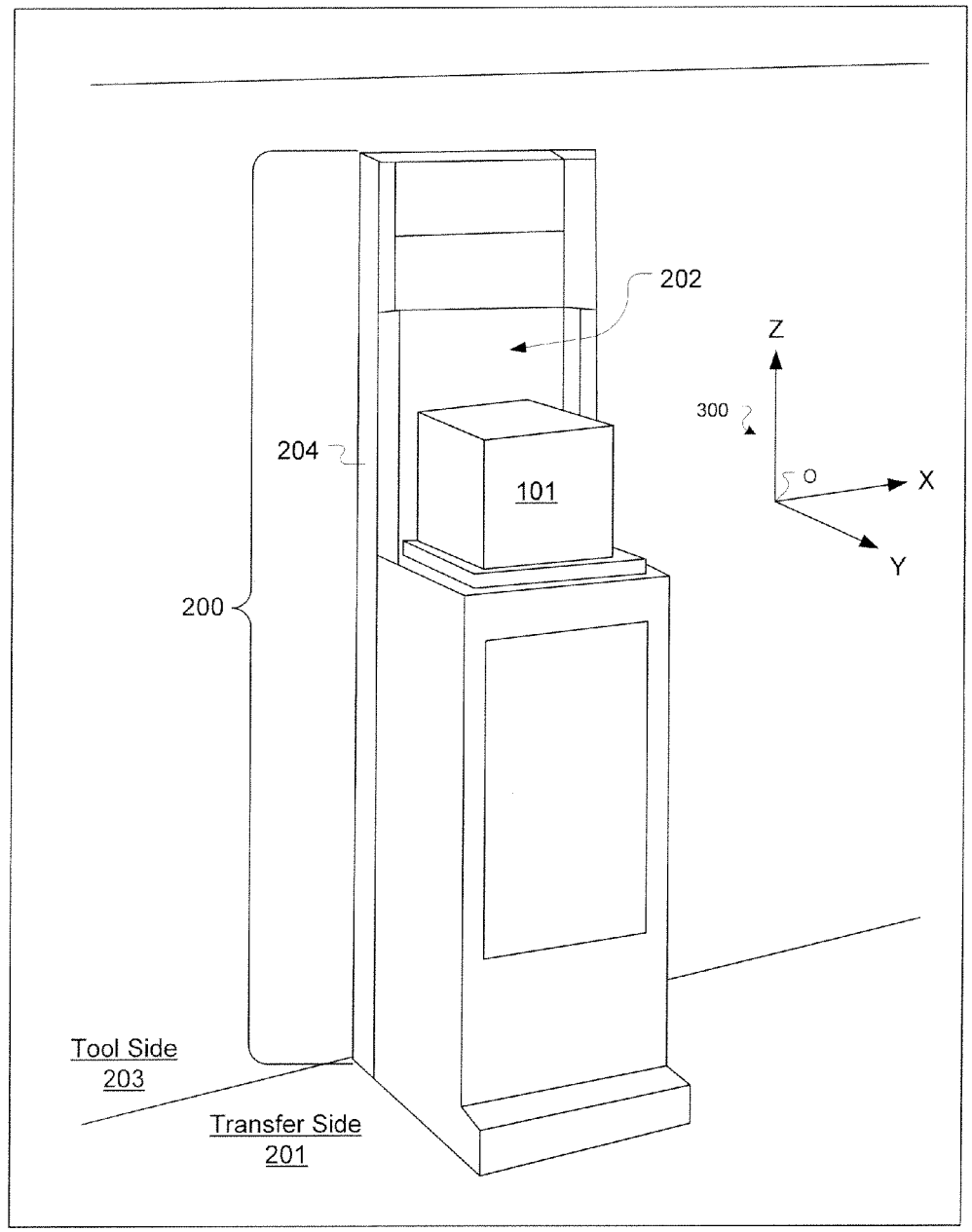
FIG. 3B shows an isometric view of the loadport, in accordance with one embodiment of the present invention.

The loadport 200 includes an isolation plate 204 that separates the transfer side 201 from the tool side 203. A window 202 is defined within the isolation plate 204. In one embodiment, a retractable closure is defined to cover the window 202 when the loadport 200 is not conducting cassette 105 transfer operations, and is defined to be removed from the window 202 during cassette 105 transfer operations. For ease of discussion, the window 202 as depicted in FIG. 3A is considered to be open to enable cassette 105 transfer operations. The loadport 200 is defined to and functions to move the cassette 105 from a transfer side stage 306, through the window 202, to a tool side stage 307, vice-versa. FIG. 3B shows an isometric view of the loadport 200, in accordance with one embodiment of the present invention.

The loadport 200 includes an articulating arm 303 defined to move within a vertical plane oriented perpendicular to the window 200. In FIG. 3A, the vertical plane is the Y-Z plane as reference by coordinate axes 300. Also, it should be understood that the X direction of the coordinate axes 300 extends through the origin O perpendicular to both the Y and Z axes, i.e., the X direction extends perpendicularly through the paper upon which FIG. 3A is printed. A spiral cam apparatus 400 is connected to a rotatable shaft 419 (shown in FIG. 4A) disposed to extend through and away from the articulating arm 303, i.e., in the X direction. The rotatable shaft 419 is defined to rotate about a first rotational axis 421 (shown in FIG. 4A), such that the spiral cam apparatus 400 rotates about the first rotational axis 421, as indicated by arrows 313. A gripper support 411 (shown in FIG. 4A) is rigidly connected to the exterior surface of the spiral cam apparatus 400. The gripper support 411 is defined to hold a gripper assembly 305. The gripper assembly 305 is defined to grasp the cassette 105 when positioned adjacent to the cassette 105.

The loadport 200 also includes an arm carriage 301 defined to move vertically, as indicated by arrow 309. The articulating arm 303 is rotatably connected to the arm carriage 301 about a second rotational axis 304 oriented parallel to the first rotational axis 421. The articulating arm 303 is defined to be rotated in a controlled manner about the second rotational axis 304, as indicated by arrows 311. Movement of the articulating arm 300 within the vertical plane and through the window 202 is provided by a combination of vertical movement of the arm carriage 301 and rotation of the articulating arm 303 about the second rotational axis 304. It should be appreciated that both the first and second rotational axes 421/304 extend perpendicular to the vertical plane (Y-Z plane) within which the articulating arm 303 is defined to move, i.e., in the X direction.

As discussed in detail below, the spiral cam apparatus 400 is defined to provide for horizontal translation (in the X direction) of the cassette 105, as the cassette 105 is moved from the transfer side stage 306 to the tool side stage 307. More specifically, the spiral cam apparatus 400 is defined to position the gripper assembly 305 at a first horizontal location relative to the X axis when the gripper assembly 305 is positioned to grasp the cassette 105 on the transfer side stage 306. As the articulating arm 303 is moved through the window 202 to place the cassette 105 on the tool side stage 307, by way of rotation of the articulating arm 303 about the second rotational axis 304 and by way of vertical movement of the arm carriage 301, the spiral cam apparatus 400 is operated to horizontally translate the gripper assembly 305 in the X direction, such that the cassette 105 has a second horizontal location relative to the X axis when placed on the tool side stage 307. A distance as measured in the X direction between the first and second horizontal locations of the cassette 105 when placed on the transfer and tool side stages 306, 307, respectively, corresponds to a horizontal displacement provided by the spiral cam apparatus 400.

Figure 4A:
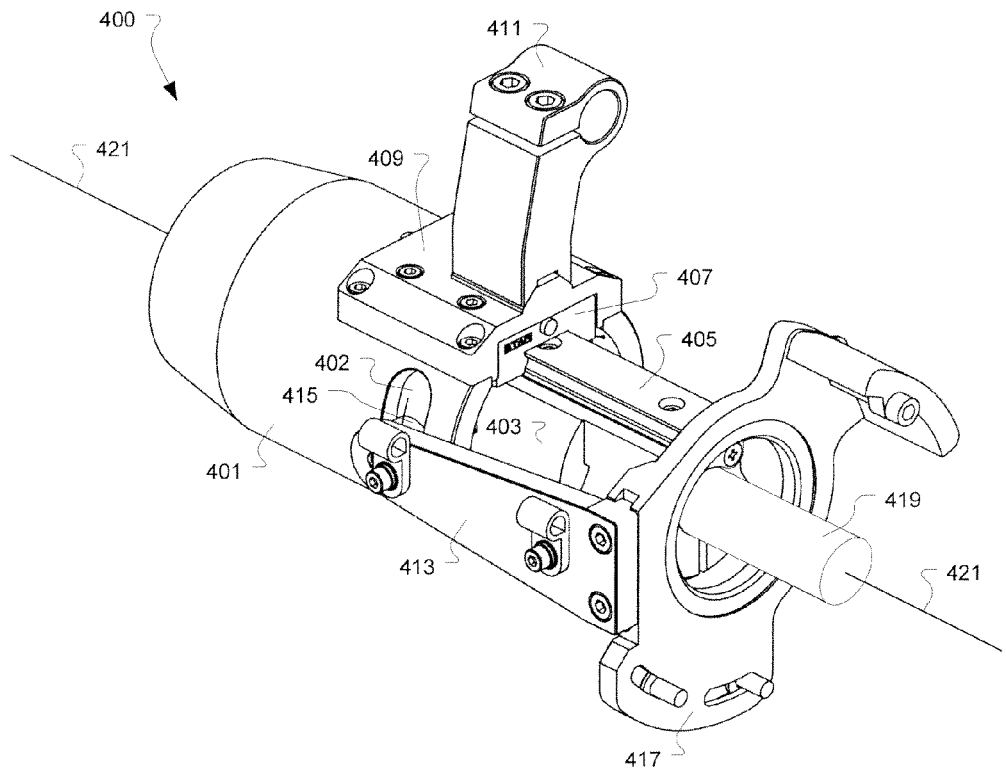
FIG. 4A shows the spiral cam apparatus, in accordance with one embodiment of the present invention.

FIG. 4A shows the spiral cam apparatus 400, in accordance with one embodiment of the present invention. The spiral cam apparatus 400 includes a spiral cam 401. The spiral cam 401 has a tubular shaped portion defined by an interior cavity and an exterior surface. The exterior surface of the spiral cam 401 includes a cam contour 402. The spiral cam apparatus 400 also includes a linear slide assembly having a length defined along the rotational axis 421. The linear slide assembly includes a linear slide body 403 defined to extend lengthwise through the interior cavity of the spiral cam 401. The linear slide assembly also includes a linear slide track 405 rigidly fixed to the linear slide body 403 and oriented to extend lengthwise in a direction parallel to the rotational axis 421. As shown in FIG. 4A, the linear slide assembly is defined to slide lengthwise into the interior cavity of the spiral cam 401. The linear slide assembly is defined to allow movement of the spiral cam 401 along the rotational axis 421 and prevent rotation of the spiral cam 401 relative to the linear slide assembly.

The spiral cam apparatus 400 also includes a cam roller 415 fixed at a position proximate to the exterior surface of the spiral cam 401. The cam roller 415 is disposed separate from the linear slide assembly. The cam roller 415 is positioned within the cam contour 402 of the spiral cam 401. The cam roller 415 is defined to engage with the cam contour 402 to cause movement of the spiral cam 401 along the rotational axis 421 when the linear slide assembly and spiral cam 401 are rotated in unison about the rotational axis 421 relative to the cam roller 415. The linear slide body 403 of the linear slide assembly is rigidly connected to a rotatable shaft 419. The rotatable shaft 419 is oriented to rotate about the rotational axis 421. Also, the rotatable shaft 410 extends through the articulating arm 303, such that a position of the rotatable shaft 419 relative to the articulating arm 303 is fixed.

A linear slide bearing 407 is rigidly connected to the spiral cam 401. The linear slide bearing 407 is defined to engage with the linear slide track 405 of the linear slide assembly, such that movement of the linear slide bearing 407 is restricted in directions other than along a length of the linear slide track 405, i.e., in a direction parallel to the rotational axis 421. In this manner, the spiral cam 401 that is rigidly connected to the linear slide bearing 407 is made to rotate in unison with the linear slide track 405, by way of rotation of the linear slide body 403, by way of rotation of the rotatable shaft 419. The linear slide bearing 407 and the linear slide track 405 are collectively defined to prevent rotation of the spiral cam 401 relative to the linear slide assembly when engaged together. The linear slide bearing 407 is defined to move freely along the length of the linear slide track 405 in the direction parallel to the rotational axis 421 when engaged with the linear slide track 405.

The spiral cam apparatus 400 also includes a gripper support 411 rigidly connected to the exterior surface of the spiral cam 401 at a position away from the cam contour 402. The gripper support 411 is defined to hold the gripper assembly 305 that is defined to grasp the cassette 105. In the embodiment of FIG. 4A, the gripper support 411 is rigidly connected to a gripper support mounting plate 409, which is rigidly connected to the spiral cam 401. In this manner, rotation of the spiral cam 401, through rotation of the linear slide assembly by way of the rotatable shaft 419, in turn causes rotation of the gripper assembly 305 connected to the gripper support 411.

The cam roller 415 is connected to a cam roller support member 413. The cam roller support member 413 is disposed in a fixed position relative to the articulating arm 303. In one embodiment, the cam roller support member 413 is rigidly connected to a cam roller mounting plate 417, which is rigidly connected to the articulating arm 303. In one embodiment, the cam roller support member 413 is defined to extend along the spiral cam 401 in a direction parallel to the rotational axis 421. The cam roller support member 413 is positioned in a spaced apart manner from the exterior surface of the spiral cam 401, such that the cam roller support member 413 does not interfere with rotation of the spiral cam 401. The cam roller 415 is connected to the cam roller support member 413 at a fixed distal position relative to the articulating arm 303 to which the cam roller mounting plate 417 is connected. In one embodiment, the cam roller 415 is rotatably connected to a pin that is connected to the cam roller support member 413 at the fixed distal position relative to the articulating arm 303. Also, in one embodiment, the cam roller 415 is oriented to have a rotational direction within a cam roller rotational plane oriented parallel to a tangent of the exterior surface of the spiral cam 401 that includes the cam contour 402. It should also be appreciated that in another embodiment, the cam roller 415 can be substituted with a cylindrically shaped rod rigidly connected to the cam roller support member 413 at the fixed distal position relative to the articulating arm 303.

Figure 4B:
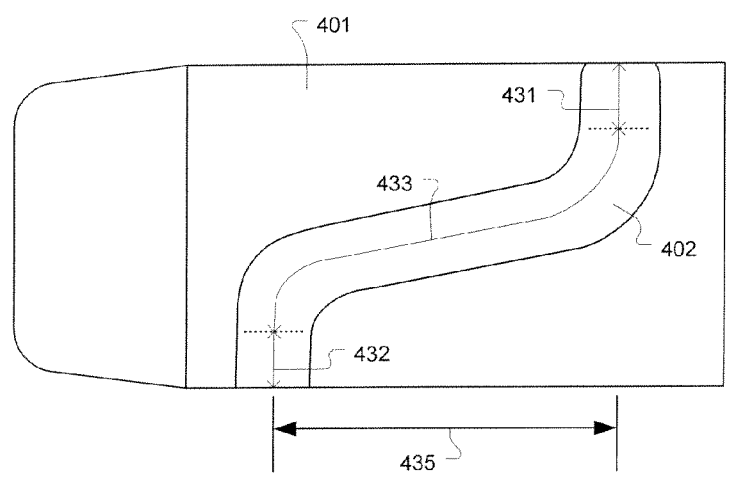
FIG. 4B shows a side view of the spiral cam, n accordance with one embodiment of the present invention.

FIG. 4B shows a side view of the spiral cam 401, in accordance with one embodiment of the present invention. The cam contour 402 includes a translational segment 433 and one or more dwell segments 431/432. The translational segment 433 is defined to cause movement of the spiral cam 401 along the rotational axis 421 as the spiral cam 401 is rotated about the rotational axis 421 relative to the cam roller 415. Specifically, with the fixed cam roller 415 disposed within the cam contour 402, action by the cam contour 402 against the fixed cam roller 415 during rotation of the spiral cam 401 causes the spiral cam 401 to move along the rotational axis 421, as afforded by the free movement of the linear slide bearing 407 along the linear slide track 405. A size of the translational segment 433 as measured in the direction parallel to the rotational axis 421 defines a translational displacement of the spiral cam 401 along the rotational axis 421, which directly corresponds to a translational displacement of the gripper assembly 305 in the direction parallel to the rotational axis 421.

Each of the one or more dwell segments 431/432 is defined to maintain a steady position of the spiral cam 401 along the rotational axis 421 as the spiral cam 401 is rotated about the rotational axis 421 relative to the cam roller 415. Specifically, when the cam roller 415 is positioned within a dwell segment 431/432 of the cam contour 402, there is no action between the cam contour 402 and the cam roller 415 to exert a force on the spiral cam 401 in the direction parallel to the rotational axis 421. The dwell segments 431/432 essentially subtend an arc about the rotational axis 421, whereas the translational segment 433 both subtends an arc about the rotational axis 421 and a distance along the rotational axis 421.

In one embodiment, such as that shown in FIG. 4B, the cam contour 402 includes one translational segment 433 and two dwell segments 431 and 432, with the one translational segment 433 positioned between the two dwell segments 431 and 432. The one translational segment 433 and the two dwell segments 431 and 432 are connected in a continuous manner along the cam contour 402. In this embodiment, the dwell segment 431 positioned closest to the articulating arm 303 corresponds to a first horizontal position of the gripper assembly 305/cassette 105, and the dwell segment 432 positioned farthest from the articulating 303 corresponds to a second horizontal position of the gripper assembly 305/cassette 105. A centerline-to-centerline distance 435 between the first and second dwell segments 431 and 432, as measured in the direction parallel to the rotational axis 421, corresponds to the horizontal displacement of the cassette 105 afforded by full traversal of the cam contour 402 along the fixed cam roller 415.

In the embodiment of FIGS. 4A-4B, the cam contour 402 is defined as a recessed channel within the exterior surface of the spiral cam 401. However, in another embodiment, the cam contour 402 is defined by a cam contour 402 bounding surface that extends radially outward from the spiral cam 401. Regardless of the embodiment, the cam contour 402 is defined to receive the cam roller 415 and provide for unimpeded movement of the cam roller 415 along the cam contour 402.

Figure 4C:
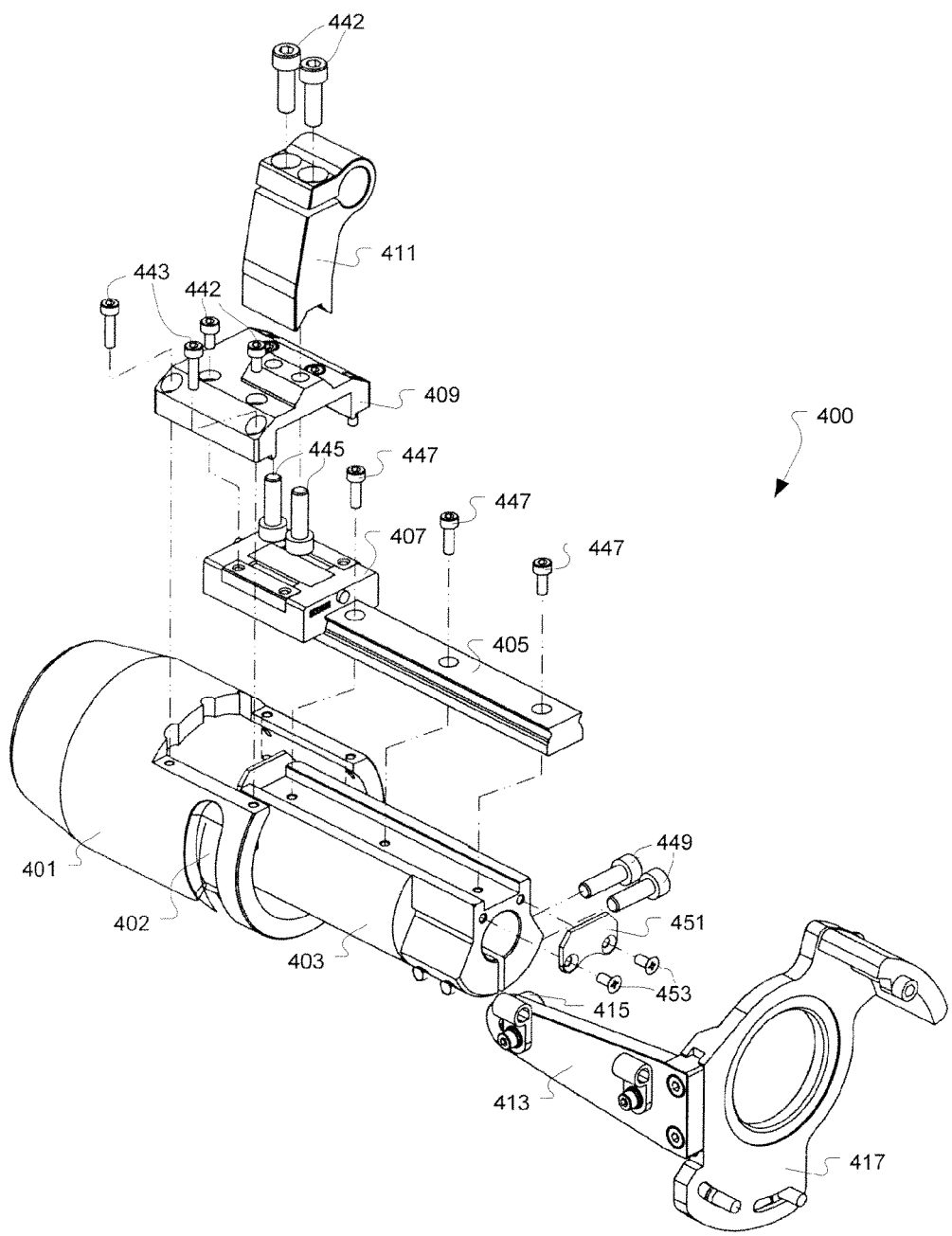
FIG. 4C shows a partial assembly view of the spiral cam apparatus, in accordance with one embodiment of the present invention.

FIG. 4C shows a partial assembly view of the spiral cam apparatus 400, in accordance with one embodiment of the present invention. The linear slide body 403 is defined to receive a number of fasteners 449 to rigidly secure the linear slide body 403 to the rotatable shaft 419. A stop plate 451 is secured to the end of the linear slide body 403 by fasteners 453. The stop plate 451 prevents runoff of the linear slide bearing 407 from the linear slide track 405. The linear slide track 405 is rigidly connected to the linear slide body 403 by a number of fasteners 447. The linear slide track 405 is defined with notched sides along its length. The linear slide bearing 407 includes a slot conformally defined to receive the linear slide track 405, such that the linear slide bearing 407 is free to move along the linear slide track 405 and is held to the linear slide track 405 by its notched sides. The gripper support 411 is rigidly connected to the gripper support mounting plate 409 by fasteners 445. The gripper support mounting plate 409 is rigidly connected to the linear slide bearing 407 by fasteners 442. The gripper support mounting plate 409 is also rigidly connected to the spiral cam 401 by fasteners 443. The gripper support 411 is defined to receive a number of fasteners 441 to rigidly secure the gripper assembly 305 to the gripper support 411.

Figure 4D:
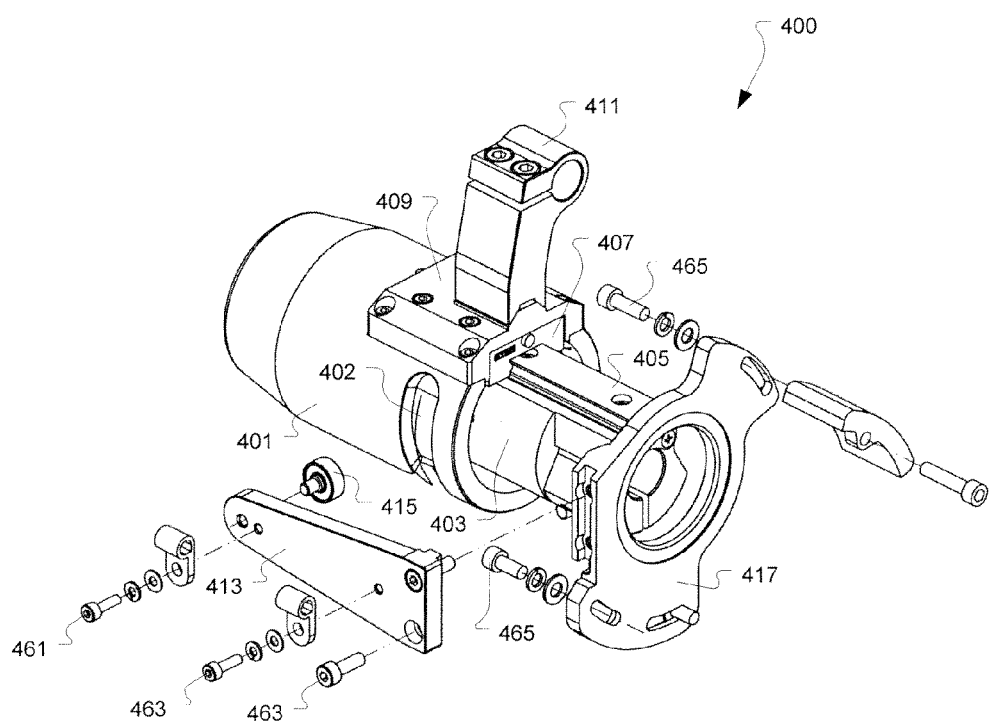
FIG. 4D shows a partial assembly view of the cam roller assembly of the spiral cam apparatus, in accordance with one embodiment of the present invention.

FIG. 4D shows a partial assembly view of the cam roller assembly of the spiral cam apparatus 400, in accordance with one embodiment of the present invention. The cam roller 415 is connected to the cam roller support member 413 by a fastener 461. The cam roller support member 413 is rigidly connected to the cam roller mounting plate 417 by fasteners 463. The cam roller mounting plate 417 is rigidly connected to the articulating arm 303 by fasteners 465. It should be appreciated that the cam roller 415 and its mechanical connection to the articulating arm 303 by way of the cam roller support member 413 and cam roller mounting plate 417 is physically separate from the rotatable shaft 419 and linear slide body 403 connected thereto.

Figure 5A:
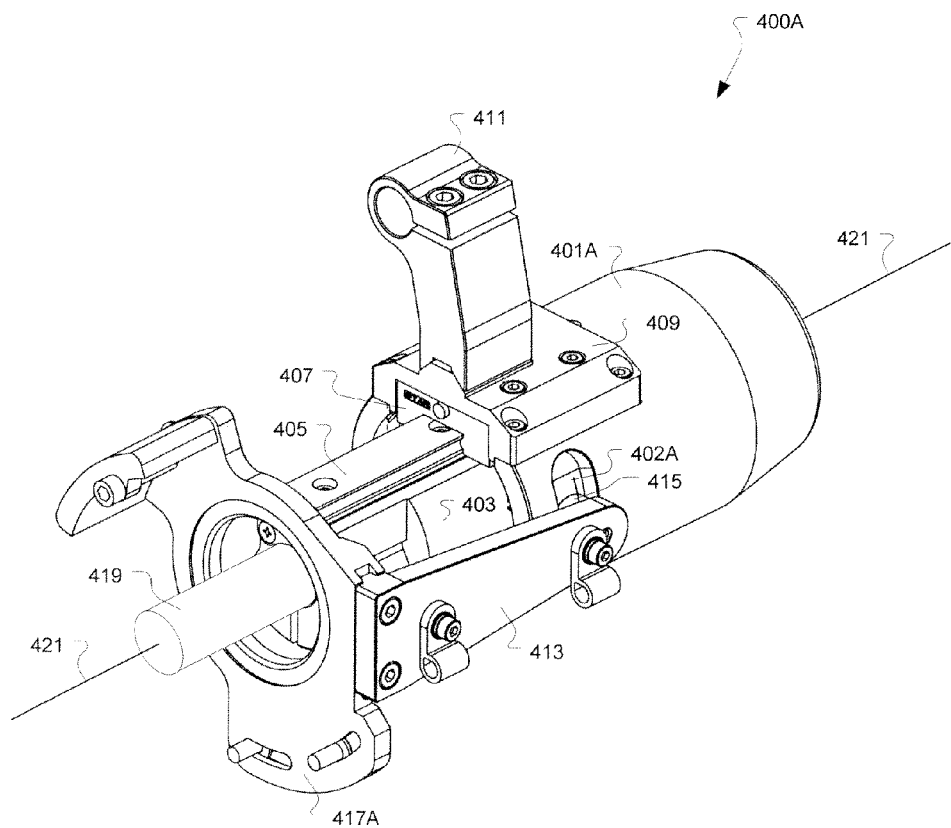
FIG. 5A shows a left-handed version of the spiral cam configured to provide for horizontal translation of the gripper assembly in a direction to the left, in accordance with one embodiment of the present invention.

FIG. 4A shows a right-handed version of the spiral cam apparatus 400 configured to provide for horizontal translation of the gripper assembly 305 in a direction to the right. FIG. 5A shows a left-handed version of the spiral cam 400A configured to provide for horizontal translation of the gripper assembly 305 in a direction to the left, in accordance with one embodiment of the present invention. The gripper support 411, gripper support mounting plate 409, linear slide bearing 407, linear slide track 405, linear slide body 403, cam roller 415, cam roller support member 413, and rotatable shaft 419 are the same as described with regard to FIG. 4A. A left-handed spiral cam 401A is defined as a mirror image of the spiral cam 401 described with regard to FIG. 4A, and includes a left-handed cam contour 402A. A left-handed cam roller mounting plate 417A is defined as a mirror image of the cam mounting plate 417 described with regard to FIG. 4A.

Figure 5B:
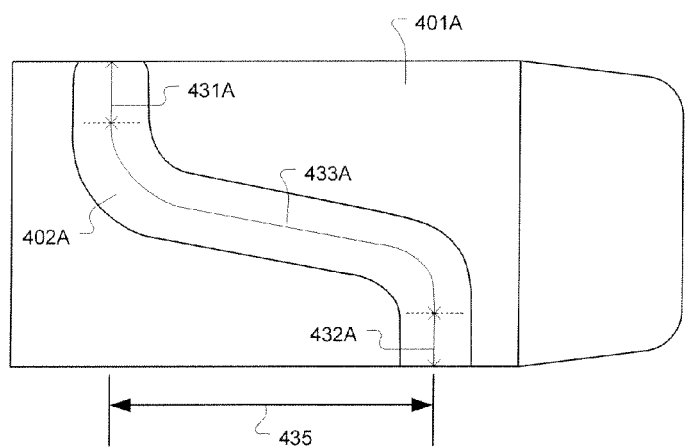
FIG. 5B shows a side view of the left-handed spiral cam, in accordance with one embodiment of the present invention.

FIG. 5B shows a side view of the left-handed spiral cam 401A, in accordance with one embodiment of the present invention. The left-handed cam contour 402A includes a translational segment 433A and one or more dwell segments 431A and 432A. As with the translational segment 433, the translational segment 433A is defined to cause movement of the left-handed spiral cam 401A along the rotational axis 421 as the left-handed spiral cam 401 is rotated about the rotational axis 421 relative to the cam roller 415. Also, each of the dwell segments 431A and 432A is defined to maintain a steady position of the left-handed spiral cam 401A along the rotational axis 421 as the left-handed spiral cam 401A is rotated about the rotational axis 421 relative to the cam roller 415. A centerline-to-centerline distance 435 between the first and second dwell segments 431A and 432A, as measured in the direction parallel to the rotational axis 421, corresponds to the horizontal displacement of the cassette 105 afforded by full traversal of the cam contour 402A along the fixed cam roller 415.

Figures 6A, 6B:
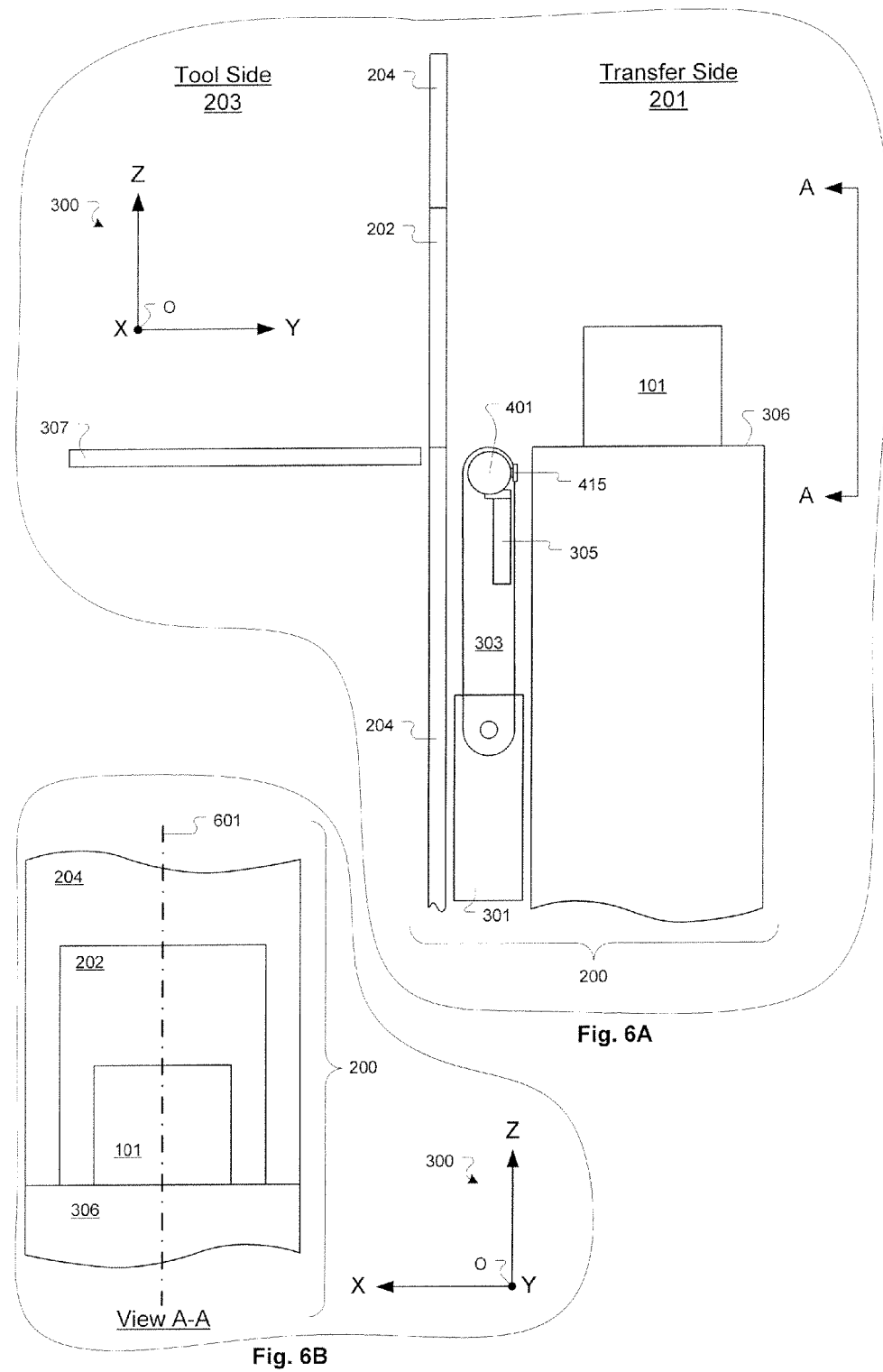
FIG. 6A shows a Y-Z plane cross-section view of a starting state of the loadport with the cassette placed on the transfer side stage, in accordance with one embodiment of the present invention.
FIG. 6B shows a X-Z plane view A-A of the loadport from the transfer side, as referenced in FIG. 6A, in accordance with one embodiment of the present invention.

FIGS. 6A through 11C show a sequence of loadport 200 operations for moving the cassette 105 from the transfer side stage 306 to the tool side stage 307. FIG. 6A shows a Y-Z plane cross-section view of a starting state of the loadport 200 with the cassette 105 placed on the transfer side stage 306, in accordance with one embodiment of the present invention. The arm carriage 301 and articulating arm 303 connected thereto are shown retracted downward into the loadport 200. FIG. 6B shows a X-Z plane view A-A of the loadport 200 from the transfer side 201, as referenced in FIG. 6A, in accordance with one embodiment of the present invention. The cassette 105 placed on the transfer side stage 306 is centered upon a centerline 601 of the loadport 200.

Figures 7A, 7B:
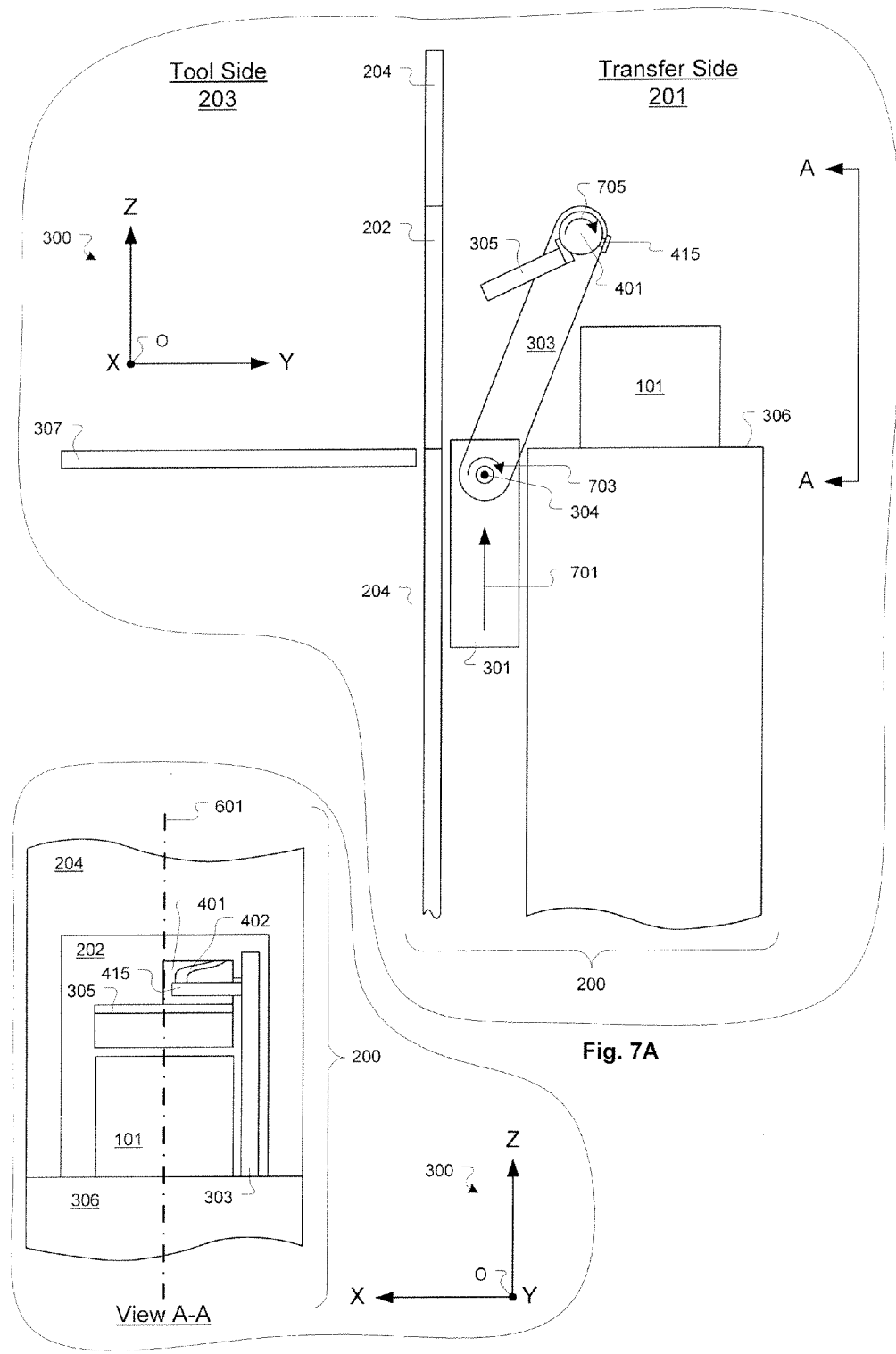
FIG. 7A shows a Y-Z plane cross-section view of the loadport moving to grasp the cassette on the transfer side stage, in accordance with one embodiment of the present invention.
FIG. 7B shows the X-Z plane view A-A of the loadport from the transfer side, as referenced in FIG. 7A, in accordance with one embodiment of the present invention.

FIG. 7A shows a Y-Z plane cross-section view of the loadport 200 moving to grasp the cassette 105 on the transfer side stage 306, in accordance with one embodiment of the present invention. The arm carriage 301 is moved vertically upward in a controlled manner, as indicated by arrow 701. The articulating arm 303 is rotated in a controlled manner about the second rotational axis 304, as indicated by arrow 703. The spiral cam 401 is rotated in a controlled manner about the rotational axis 421, as indicated by arrow 705. FIG. 7B shows the X-Z plane view A-A of the loadport 200 from the transfer side 201, as referenced in FIG. 7A, in accordance with one embodiment of the present invention. The cam roller 415 resides in the dwell segment 432 of the cam contour 402 farthest away from the articulating arm 303.

Figure 8A:
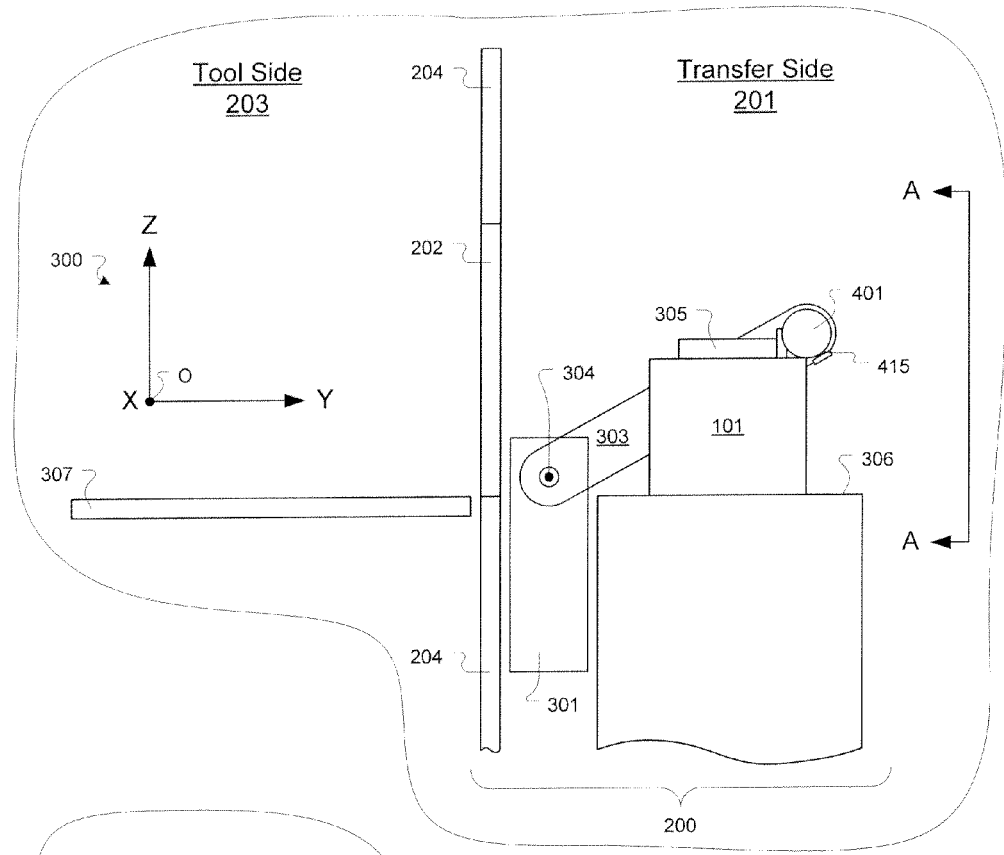
FIG. 8A shows a Y-Z plane cross-section view of the loadport with the gripper assembly positioned to grasp a top portion of the cassette on the transfer side stage, in accordance with one embodiment of the present invention.
Figure 8B:
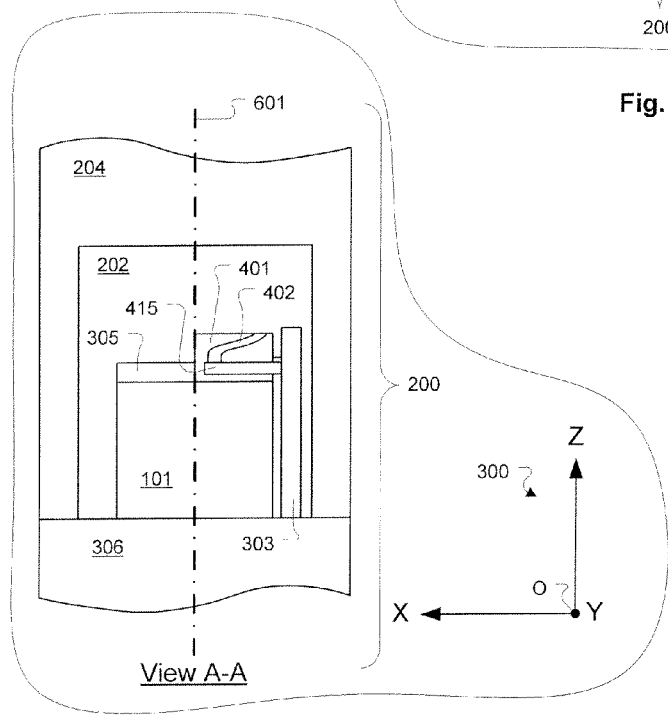
FIG. 8B shows the X-Z plane view A-A of the loadport from the transfer side, as referenced in FIG. 8A, in accordance with one embodiment of the present invention.

FIG. 8A shows a Y-Z plane cross-section view of the loadport 200 with the gripper assembly 305 positioned to grasp a top portion of the cassette 105 on the transfer side stage 306, in accordance with one embodiment of the present invention. The gripper assembly 305 is operated to grasp the cassette 105 so as to secure the cassette 105 to the gripper assembly 305. FIG. 8B shows the X-Z plane view A-A of the loadport 200 from the transfer side 201, as referenced in FIG. 8A, in accordance with one embodiment of the present invention. The cam roller 415 continues to reside in the dwell segment 432 of the cam contour 402 farthest away from the articulating arm 303.

Figures 9A, 9B:
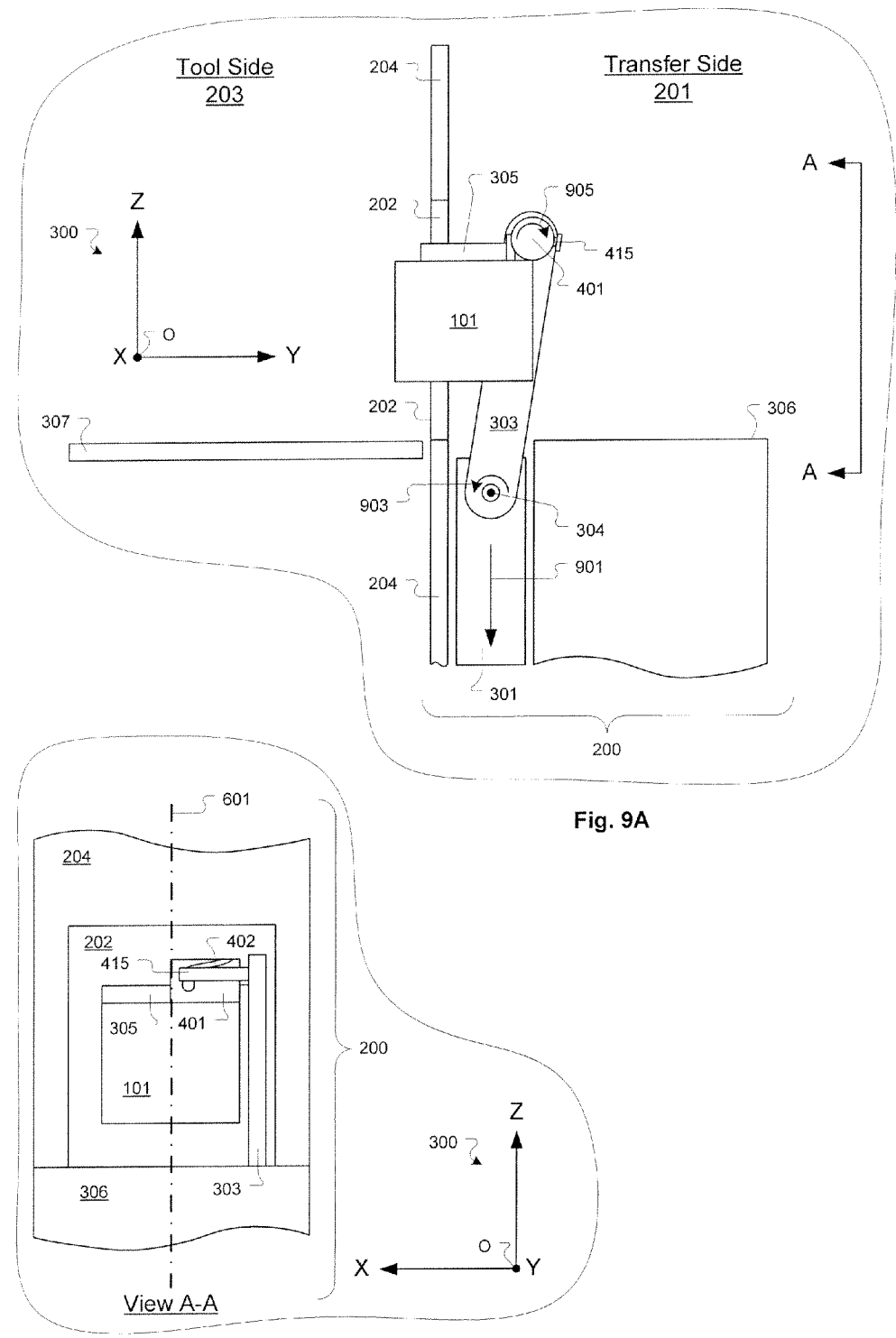
FIG. 9A shows a Y-Z plane cross-section view of the loadport moving to transfer the cassette from the transfer side stage, through the window to the tool side stage, in accordance with one embodiment of the present invention.
FIG. 9B shows the X-Z plane view A-A of the loadport from the transfer side, as referenced in FIG. 9A, in accordance with one embodiment of the present invention.

FIG. 9A shows a Y-Z plane cross-section view of the loadport 200 moving to transfer the cassette 105 from the transfer side stage 306, through the window 202 to the tool side stage 307, in accordance with one embodiment of the present invention. The arm carriage 301 is moved vertically downward in a controlled manner, as indicated by arrow 901. The articulating arm 303 is rotated in a controlled manner about the second rotational axis 304, as indicated by arrow 903. The spiral cam 401 is rotated in a controlled manner about the rotational axis 421, as indicated by arrow 905. FIG. 9B shows the X-Z plane view A-A of the loadport 200 from the transfer side 201, as referenced in FIG. 9A, in accordance with one embodiment of the present invention. As the spiral cam 401 is rotated about the rotational axis 421 relative to the cam roller 415, the cam roller 415 moves along the cam contour 402 toward the translational segment 433 of the cam contour 402.

Figure 10A:
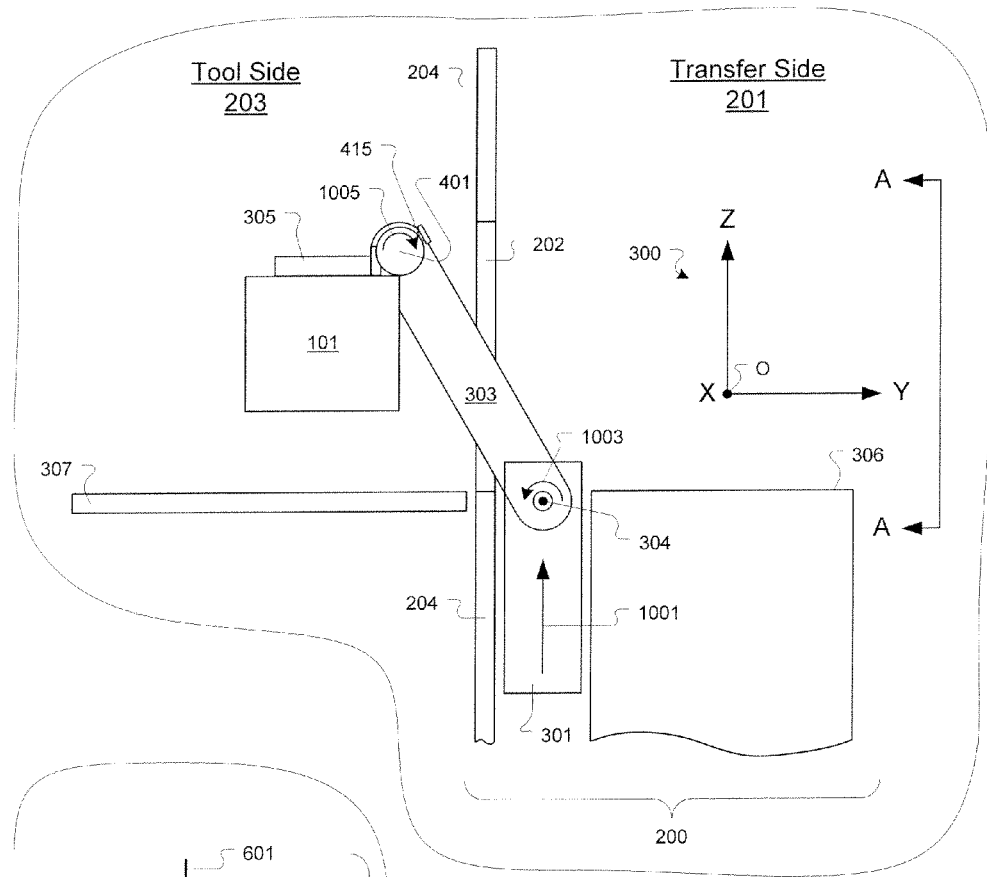
FIG. 10A shows a Y-Z plane cross-section view of the loadport continuing to transfer the cassette from the transfer side stage, through the window to the tool side stage, in accordance with one embodiment of the present invention.
Figure 10B:
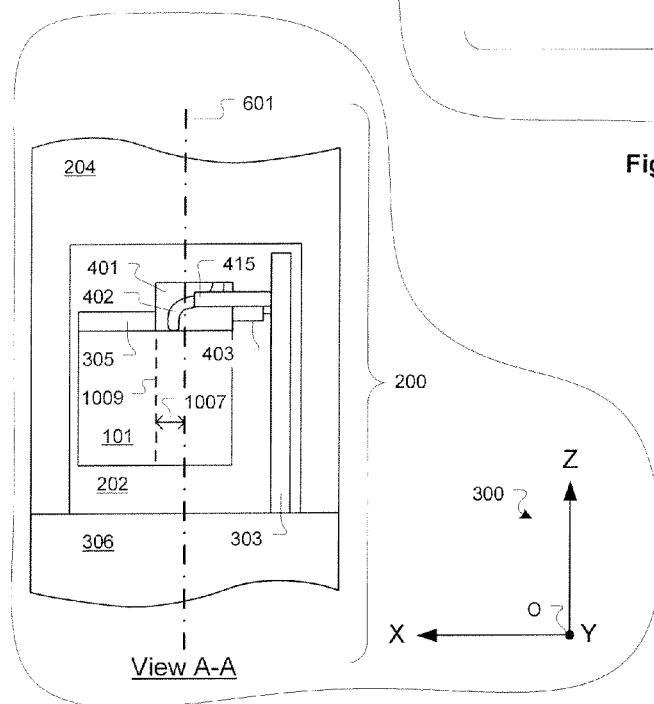
FIG. 10B shows the X-Z plane view A-A of the loadport from the transfer side, as referenced in FIG. 10A, in accordance with one embodiment of the present invention.

FIG. 10A shows a Y-Z plane cross-section view of the loadport 200 continuing to transfer the cassette 105 from the transfer side stage 306, through the window 202 to the tool side stage 307, in accordance with one embodiment of the present invention. The arm carriage 301 is now moved vertically upward in a controlled manner, as indicated by arrow 1001. The articulating arm 303 continues to rotate in a controlled manner about the second rotational axis 304, as indicated by arrow 1003. The spiral cam 401 continues to rotate in a controlled manner about the rotational axis 421, as indicated by arrow 1005. FIG. 10B shows the X-Z plane view A-A of the loadport 200 from the transfer side 201, as referenced in FIG. 10A, in accordance with one embodiment of the present invention. As the spiral cam 401 is rotated about the rotational axis 421 relative to the cam roller 415, the cam roller 415 moves along the cam contour 402 within the translational segment 433 of the cam contour 402. This causes the spiral cam 401 to move horizontally in the X direction away from the articulating arm 303, which in turn causes the gripper assembly 305 and cassette 105 grasped thereby to also move horizontally in the X direction away from the articulating arm 303. Therefore, as the spiral cam 401 rotates relative to the cam roller 415 within the translational segment 433 of the cam contour 402, a centerline 1009 of the cassette 105 is horizontally translated relative to the centerline 601 of the loadport 200, as indicated by arrow 1007.

Figure 11A:
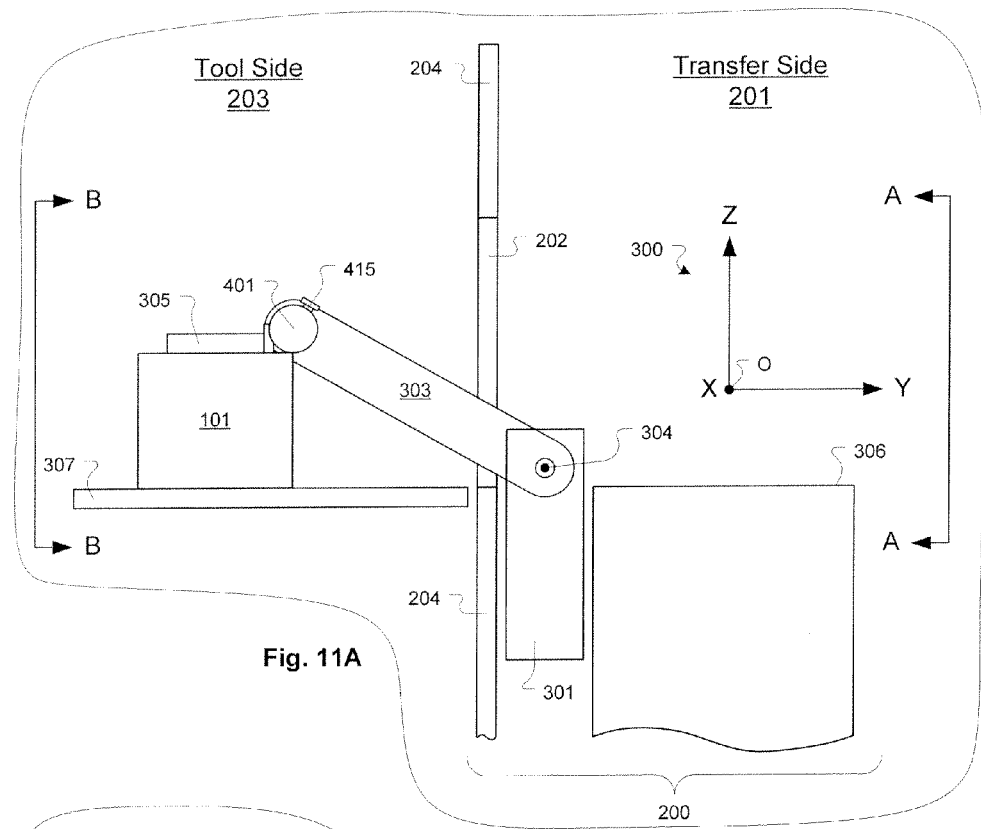
FIG. 11A shows a Y-Z plane cross-section view of the loadport with the cassette placed on the tool side stage, in accordance with one embodiment of the present invention.
Figure 11B:
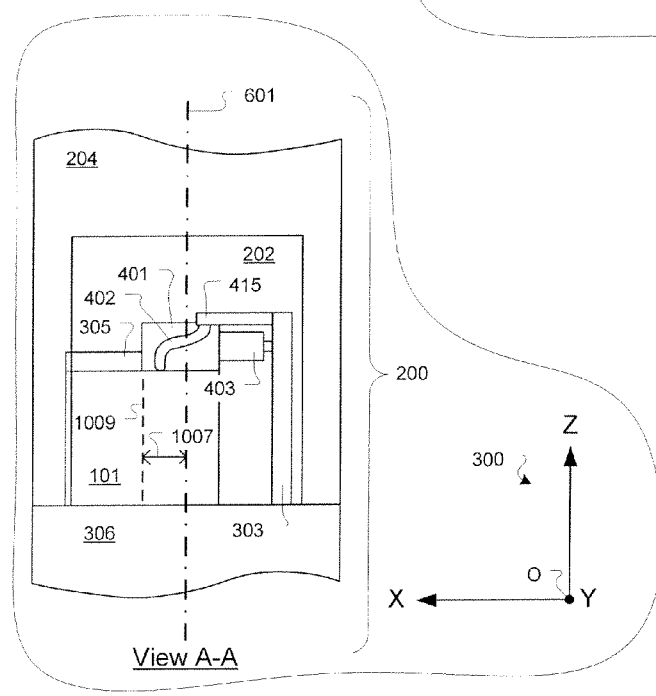
FIG. 11B shows the X-Z plane view A-A of the loadport from the transfer side, as referenced in FIG. 11A, in accordance with one embodiment of the present invention.
Figure 11C:
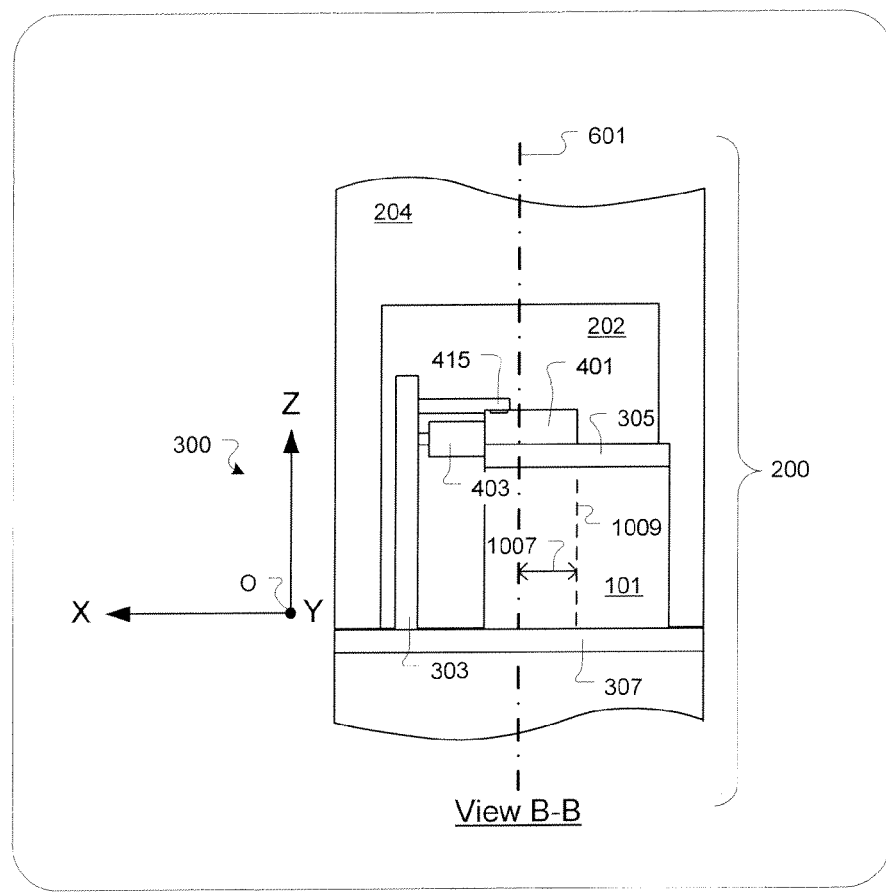
FIG. 11C shows the X-Z plane view B-B of the loadport from the tool side, as referenced in FIG. 11A, in accordance with one embodiment of the present invention.

FIG. 11A shows a Y-Z plane cross-section view of the loadport 200 with the cassette 105 placed on the tool side stage 307, in accordance with one embodiment of the present invention. FIG. 11B shows the X-Z plane view A-A of the loadport 200 from the transfer side 201, as referenced in FIG. 11A, in accordance with one embodiment of the present invention. The cam roller 415 now resides in the dwell segment 431 of the cam contour 402 closest to the articulating arm 303. This represents a maximum horizontal translation of the spiral cam 401 afforded by the cam contour 402. With the cam contour 402 fully traversed by the cam roller 415, the centerline 1009 of the cassette 105 is horizontally translated relative to the centerline 601 of the loadport 200 by a maximum amount afforded by the cam contour 402, as indicated by arrow 1007. FIG. 11C shows the X-Z plane view B-B of the loadport 200 from the tool side 203, as referenced in FIG. 11A, in accordance with one embodiment of the present invention. It should be understood that the motion of the loadport 200 as depicted in FIGS. 6A through 11C can be conducted in a reverse manner to move the cassette 105 from the tool side stage 307 to the transfer side stage 201.

Figure 12:
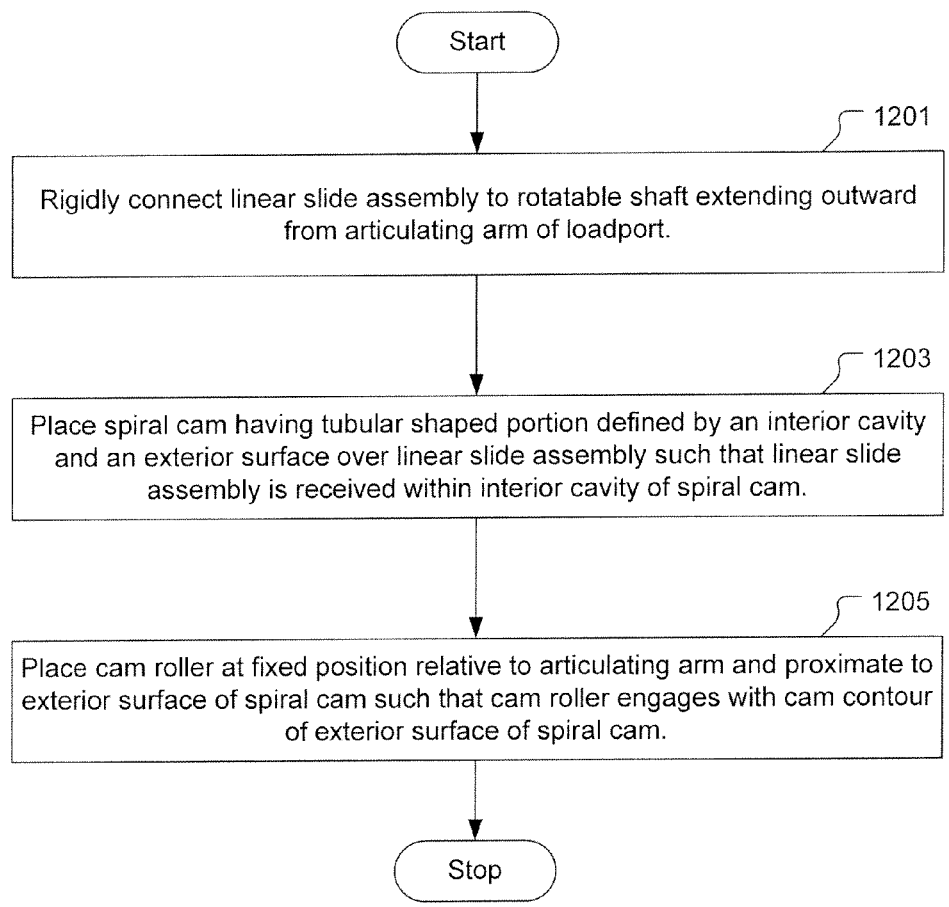
FIG. 12 shows a method for operating a loadport to provide horizontal displacement of an object, e.g., cassette, in accordance with one embodiment of the present invention.

FIG. 12 shows a method for operating a loadport 200 to provide horizontal displacement of an object, e.g., cassette 105, in accordance with one embodiment of the present invention. The method includes an operation 1201 for rigidly connecting a linear slide assembly, i.e., linear slide body 403, to a rotatable shaft 419 extending outward from an articulating arm 303 of a loadport 202. The rotatable shaft 419 has a rotational axis 421 oriented in a horizontal direction, i.e., X direction. The method also includes an operation 1203 for placing a spiral cam 401 having a tubular shaped portion defined by an interior cavity and an exterior surface over the linear slide assembly, such that the linear slide assembly is received within the interior cavity of the spiral cam 401. The interior cavity of the spiral cam 401 interfaces with the linear slide assembly such that the spiral cam 401 is freely movable along a length of the linear slide assembly, and such that the spiral cam 401 is prevented from rotating relative to the linear slide assembly. The exterior surface of the spiral cam 401 includes a cam contour 402. The method further includes an operation 1205 for placing a cam roller 415 at a fixed position relative to the articulating arm 303 and proximate to the exterior surface of the spiral cam 401, such that the cam roller 415 engages with the cam contour 402 of the exterior surface of the spiral cam 401.

The method includes an operation for rotating the spiral cam 401 relative to the cam roller 415 through rotation of the linear slide assembly by way of the rotatable shaft 419. Rotation of the spiral cam 401 causes the cam contour 402 of the exterior surface of the spiral cam 401 to traverse along the cam roller 415 and cause movement of the spiral cam 401 in the horizontal direction. The cam contour 402 includes a translational segment 433 and one or more dwell segments 431/432. The translational segment 433 is defined to cause movement of the spiral cam 401 in the horizontal direction as the spiral cam 401 is rotated relative to the cam roller 415. Each of the one or more dwell segments 431/432 is defined to maintain a steady position of the spiral cam 401 in the horizontal direction as the spiral cam 401 is rotated relative to the cam roller 415. In one embodiment of the method, the cam contour 402 includes one translational segment 433 and two dwell segments 431 and 432, with the one translational segment 433 positioned between the two dwell segments 431 and 432. In this embodiment, the one translational segment 433 and two dwell segments 431 and 432 are connected in a continuous manner along the cam contour 402. A size of the translational segment 433 as measured in the horizontal direction defines a translational displacement of the spiral cam 401 in the horizontal direction.

The method also includes an operation for rigidly connecting a gripper support 411 to the exterior surface of the spiral cam 401 at a position away from the cam contour 402. The gripper support 411 is defined to hold a gripper assembly 305 that is defined to grasp a cassette 105.

The method also includes an operation for positioning the articulating arm 303 at a first angular position and rotating the rotatable shaft 419 to a first rotational position to allow the gripper assembly 305 to grasp the cassette 105 at a first location, such as shown in FIGS. 7A through 8B. The first rotational position corresponds to engagement of the cam roller 415 with a distal segment of the cam contour 402 relative to the articulating arm 303. The method also includes actuating the gripper assembly 305 to grasp the cassette 105, such as shown in FIGS. 8A and 8B. The method also includes moving the articulating arm 303 to a second angular position so as to move the cassette 105 to a second location, such as shown in FIGS. 9A through 11C. The method further includes rotating the rotatable shaft 419 as the articulating arm 303 is moved to the second angular position. Rotation of the rotatable shaft 419 causes the cam contour 402 to move along the cam roller 415 and correspondingly causes the spiral cam 401 to move in the horizontal direction away from the articulating arm 303, such that the cassette 105 is displaced in the horizontal direction between the first and second locations.

In one embodiment, the rotatable shaft 419 is rotated as the articulating arm 303 is moved, so as to maintain an attitudinal orientation of the cassette 105 during movement of the cassette 105 between the first and second locations. Also, in one embodiment, the articulating arm 303 is vertically moved simultaneously with movement of the articulating arm 303 to the second angular position, so as to move the cassette 105 through a window 202 of the loadport 200.

Figure 13A:
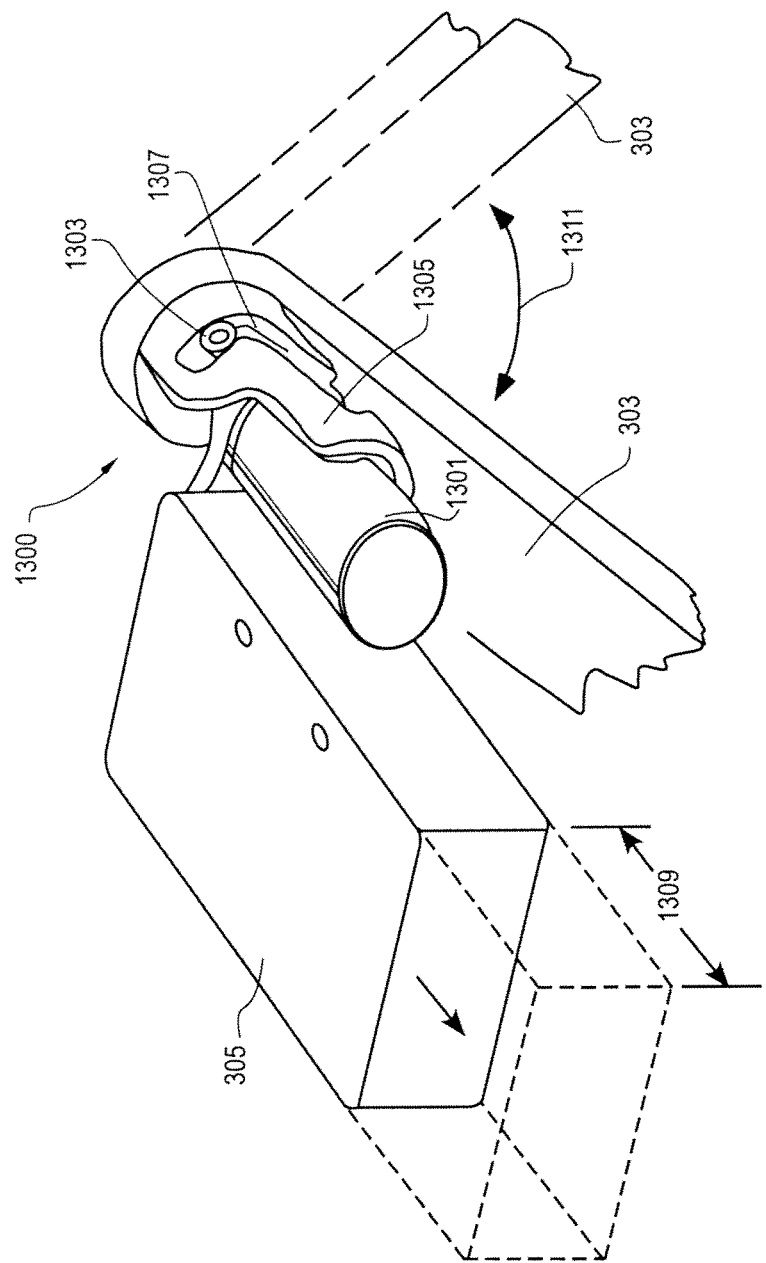
FIG. 13A shows an isometric view of a spiral cam apparatus in which a cam roller is fixed to a linear slide, and in which a tubular spiral cam is rigidly connected to the articulating arm, in accordance with one embodiment of the present invention.

FIG. 13A shows an alternate embodiment in which the relative positions of the cam contour 402 and cam roller 415, as previously discussed, are reversed. Specifically, FIG. 13A shows an isometric view of a spiral cam apparatus 1300 in which a cam roller 1303 is fixed to a linear slide 1301, and in which a tubular spiral cam 1305 is rigidly connected to the articulating arm 303, in accordance with one embodiment of the present invention. The linear slide 1301 effectively replaces the spiral cam 401 of the previously described spiral cam apparatus 400. The tubular spiral cam 1305 effectively replaces the cam roller support member 413 and the cam roller 415. The cam roller 1303 is connected to the linear slide 1301 at a fixed position near the end of the linear slide 1301 closest to the articulating arm 303.

The tubular spiral cam 1305 includes a cam contour 1307 through which the cam roller 1303 is received and travels. The cam contour 1307 is defined like the cam contour 402 previously described with regard to the spiral cam apparatus 400. Rotation of the linear slide 1301, with corresponding rotation of the cam roller 1303, relative to the tubular spiral cam 1305 causes the cam roller 1303 to follow the cam contour 1307. As the cam roller 1303 follows a translational segment of the cam contour 1307, the linear slide 1301 is forced to move in the horizontal direction 1309, which in turn causes movement of the gripper assembly 305 in the horizontal direction 1309 through the rigid connection of the gripper assembly 305 to the linear slide 1301. Additionally, the articulating arm 303 is defined to move through an angle 1311, such as previous discussed with regard to rotation of the articulating arm 303 about the second rotational axis 304.

Figure 13B:
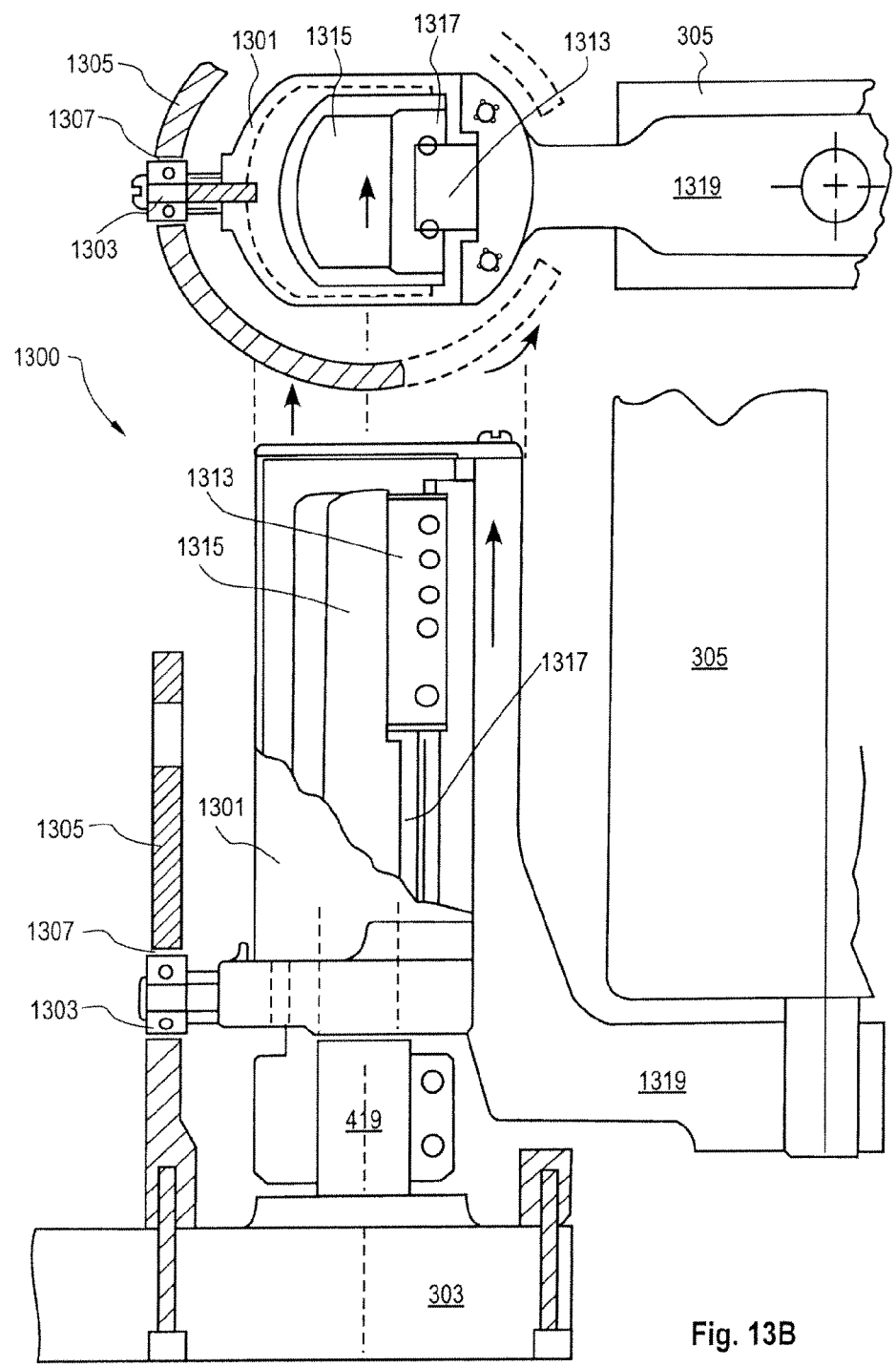
FIG. 13B shows cross-sectional views of the spiral cam apparatus, in accordance with one embodiment of the present invention.

FIG. 13B shows cross-sectional views of the spiral cam apparatus 1300, in accordance with one embodiment of the present invention. The linear slide 1301 includes an interior cavity formed to receive a linear slide assembly that is rigidly connected to the rotatable shaft 419. The linear slide assembly in this embodiment includes a linear slide body 1315, a linear slide bearing 1313, and a linear slide track 1317, which perform respectively similar functions as the a linear slide body 403, a linear slide bearing 407, and a linear slide track 405, as previously described with regard to the spiral cam apparatus 400. A gripper support 1319 is rigidly connected to the linear slide 1301 and is defined to hold the gripper assembly 305.

Figure 13C:
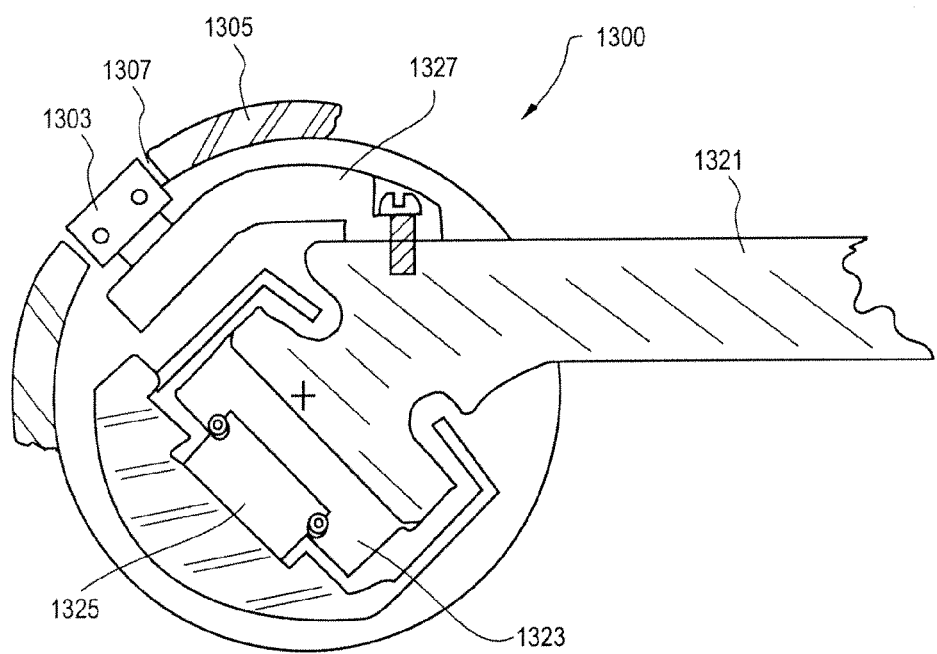
FIG. 13C shows a cross-section of the spiral cam apparatus, in accordance with an alternate embodiment.

FIG. 13C shows a cross-section of the spiral cam apparatus 1300, in accordance with an alternate embodiment. In this embodiment, a gripper support 1321 is connected to a linear slide bearing 1323 that is defined to slide on a linear slide track 1325. Also, in this embodiment the cam roller 1303 is connected to the gripper support 1321 through a cam roller support member 1327. The cam roller 1303 engages the cam contour 1307 defined within the tubular spiral cam 1305, as discussed in the previous embodiment.

Figure 14:
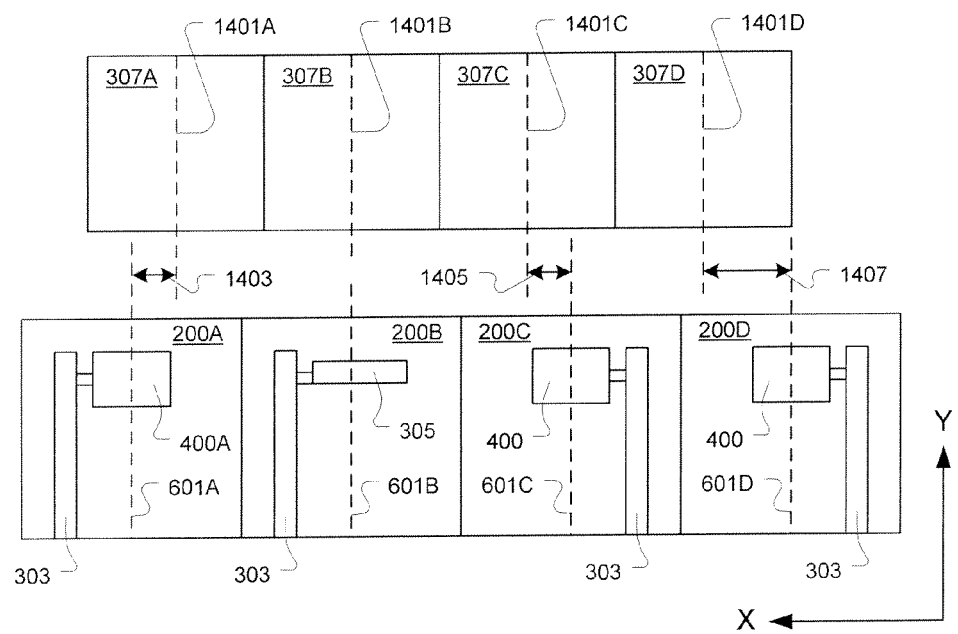
FIG. 14 shows an exemplary plan view of a number of loadports positioned to service a number of tool indexers having tool side stages, in accordance with one embodiment of the present invention.

FIG. 14 shows an exemplary plan view of a number of loadports 200A-200D positioned to service a number of tool indexers having tool side stages 307A-307D, in accordance with one embodiment of the present invention. For one reason or another, it may not be possible to place the loadports 200A-200D relative to the tool side stages 307A-307D such that the centerlines 601A-601D of the loadports 200A-200D are respectively aligned with the centerlines 1401A-1401D of the tool side stages 307A-307D. In this case, the spiral cam apparatus 400 enables each of the loadports 200A-200D to service a respective one of the tool side stages 307A-307D. Specifically, the loadport 200A is equipped with a left-handed spiral cam apparatus 400A to provide for horizontal displacement of the cassette, as indicated by arrow 1403 as it is moved between the loadport 200A and the tool side stage 307A.

The centerline 601B of the loadport 200B is aligned with the centerline 1401B of the tool side stage 307B. Therefore, horizontal displacement of the cassette as it is moved between the loadport 200B and the tool side stage 307B is not necessary. In this case, the loadport 200B can be equipped with a gripper assembly 305 directly connected to the rotatable shaft 419.

The loadport 200C is equipped with a right-handed spiral cam apparatus 400 to provide for horizontal displacement of the cassette, as indicated by arrow 1405 as it is moved between the loadport 200C and the tool side stage 307C. Similarly, the loadport 200D is equipped with a right-handed spiral cam apparatus 400 to provide for horizontal displacement of the cassette, as indicated by arrow 1407 as it is moved between the loadport 200D and the tool side stage 307D. Considering the above example, it should be appreciated that use of the spiral cam apparatus 400 can significantly improve efficiency in fabrication facility floor planning and space utilization.

Regardless of the particular embodiment, it should be understood that the various spiral cam apparatuses disclosed herein provide a horizontal travel function by harnessing the articulating arm's 303 motion profile to a horizontal mechanical translation axis, i.e., along the rotational axis 421 oriented in the X direction. By use of the spiral cam, e.g., spiral cam 401, with selected translation segment 433 and dwell segments 431/432, a controlled amount of translation in the X direction during the cassette 105 loading process is enabled. The relative rotational displacement between the articulating arm 303 and the rotatable shaft 419 for the gripper assembly 305 is "harnessed" by the spiral cam 401 to effect a controlled amount of X axis displacement at a desired arc sector of the articulating arm 303. The timing and extent of the horizontal movement along the rotational axis 421 can be selectably determined by defining the cam contour 402 to initiate and end the X direction motion of the spiral cam 401 in a manner appropriate to the needs of a particular tool.

The spiral cam 401 is designed with a unique tubular shape that internally incorporates the linear slide bearing 407 that supports and guides the lateral translation motion in a manner that is space efficient and that also isolates the linear slide bearing 407 assembly from direct exposure to the ultra-clean zone through which the semiconductor wafers contained in the cassette 105 are to be transferred. Further, this tubular shape of the spiral cam 401 provides an opportunity to manufacture a variety of cam profiles, i.e., cam contours 402, for different motion profile requirements in a simple manner. In each case, the tubular-shaped spiral cam 401 attaches to the articulating arm 303 in the same manner, thereby resulting in versatile configurability. It should be appreciated that through the use of this invention, SMIF Pod based cassette transfer systems and their associated advantages of superior cleanliness and semiconductor wafer protection can now be applied to tools that were previously incapable of integration with SMIF type cassette transfer arms.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:
1. A spiral cam apparatus, comprising:
   a spiral cam having a tubular shaped portion defined by an interior cavity and an exterior surface, wherein the exterior surface includes a cam contour;
   a linear slide assembly having a length defined along a rotational axis, the linear slide assembly defined to slide lengthwise into the interior cavity of the spiral cam, the linear slide assembly defined to allow movement of the spiral cam along the rotational axis and prevent rotation of the spiral cam relative to the linear slide assembly; and
   a cam roller fixed at a position proximate to the exterior surface of the spiral cam, the cam roller disposed separate from the linear slide assembly, wherein the cam roller is positioned within the cam contour of the spiral cam, the cam roller defined to engage with the cam contour to cause movement of the spiral cam along the rotational axis when the linear slide assembly and spiral cam are rotated in unison about the rotational axis relative to the cam roller.

2. A spiral cam apparatus as recited in claim 1, wherein the cam contour includes a translational segment and one or more dwell segments, wherein the translational segment is defined to cause movement of the spiral cam along the rotational axis as the spiral cam is rotated about the rotational axis relative to the cam roller, and wherein each of the one or more dwell segments is defined to maintain a steady position of the spiral cam along the rotational axis as the spiral cam is rotated about the rotational axis relative to the cam roller.

3. A spiral cam apparatus as recited in claim 2, wherein the cam contour includes one translational segment and two dwell segments with the one translational segment positioned between the two dwell segments, wherein the one translational segment and two dwell segments are connected in a continuous manner along the cam contour.

4. A spiral cam apparatus as recited in claim 2, wherein a size of the translational segment as measured in a direction parallel to the rotational axis defines a translational displacement of the spiral cam along the rotational axis.

5. A spiral cam apparatus as recited in claim 1, further comprising:
   a gripper support rigidly connected to the exterior surface of the spiral cam at a position away from the cam contour, the gripper support defined to hold a gripper assembly that is defined to grasp an object.

6. A spiral cam apparatus as recited in claim 1, wherein the linear slide assembly includes a linear slide body defined to extend lengthwise through the interior cavity of the spiral cam, and a linear slide track rigidly fixed to the linear slide body and oriented to extend lengthwise in a direction parallel to the rotational axis.

7. A spiral cam apparatus as recited in claim 6, further comprising:
   a linear slide bearing rigidly connected to the spiral cam, the linear slide bearing defined to engage with the linear slide track such that movement of the linear slide bearing is restricted in directions other than along a length of the linear slide track, wherein the linear slide bearing is defined to move freely along the length of the linear slide track in the direction parallel to the rotational axis when engaged with the linear slide track.

8. A spiral cam apparatus as recited in claim 7, wherein the linear slide bearing and the linear slide track are collectively defined to prevent rotation of the spiral cam relative to the linear slide assembly when engaged together.

9. A spiral cam apparatus as recited in claim 1, wherein linear slide assembly is rigidly connected to a rotatable shaft, the rotatable shaft oriented to rotate about the rotational axis, the rotatable shaft extending through an articulating arm such that a position of the rotatable shaft relative to the articulating arm is fixed.

10. A spiral cam apparatus as recited in claim 9, further comprising:
a cam roller support member disposed in a fixed position relative to the articulating arm, the cam roller support member defined to extend along the spiral cam in a direction parallel to the rotational axis, the cam roller support member positioned in a spaced apart manner from the exterior surface of the spiral cam, wherein the cam roller is connected to the cam roller support member at a fixed distal position relative to the articulating arm.

11. A spiral cam apparatus as recited in claim 10, wherein the cam roller is rotatably connected to a pin, and wherein the pin is connected to the cam roller support member at the fixed distal position relative to the articulating arm.

12. A spiral cam apparatus as recited in claim 11, wherein the cam roller is oriented to have a rotational direction within a cam roller rotational plane oriented parallel to a tangent of the exterior surface of the spiral cam that includes the cam contour.

13. A loadport, comprising:
an articulating arm;
a rotatable shaft disposed to extend through and away from the articulating arm, the rotatable shaft defined to rotate about a first rotational axis;
a linear slide assembly rigidly connected to the rotatable shaft such that a length of the linear slide assembly extends along the first rotational axis away from the articulating arm;
a spiral cam having a tubular shaped portion defined by an interior cavity and an exterior surface, the spiral cam defined to receive the linear slide assembly within the interior cavity, the linear slide assembly defined to allow movement of the spiral cam along the first rotational axis and prevent rotation of the spiral cam relative to the linear slide assembly, such that both the spiral cam and the linear slide assembly are configured to rotate in unison with rotation of the rotatable shaft, and wherein the exterior surface of the spiral cam includes a cam contour; and
a cam roller disposed at a fixed position relative to the articulating arm and proximate to the exterior surface of the spiral cam, the cam roller disposed separate from the linear slide assembly and rotatable about a shaft, wherein the cam roller is positioned within the cam contour of the spiral cam, the cam roller defined to engage with the cam contour to cause movement of the spiral cam along the first rotational axis when the spiral cam is rotated relative to the cam roller through rotation of the linear slide assembly by way of the rotatable shaft.

14. A loadport as recited in claim 13, wherein the cam contour includes a translational segment and one or more dwell segments, wherein the translational segment is defined to cause movement of the spiral cam along the first rotational axis as the spiral cam is rotated about the first rotational axis relative to the cam roller, and wherein each of the one or more dwell segments is defined to maintain a steady position of the spiral cam along the first rotational axis as the spiral cam is rotated about the first rotational axis relative to the cam roller.

15. A loadport as recited in claim 13, further comprising:
a gripper support rigidly connected to the exterior surface of the spiral cam at a position away from the cam contour, the gripper support defined to hold a gripper assembly that is defined to grasp an object.

16. A loadport as recited in claim 13, wherein the linear slide assembly includes a linear slide body defined to extend lengthwise through the interior cavity of the spiral cam, and a linear slide track rigidly fixed to the linear slide body and oriented to extend lengthwise in a direction parallel to the first rotational axis.

17. A loadport as recited in claim 16, further comprising:
a linear slide bearing rigidly connected to the spiral cam, the linear slide bearing defined to engage with the linear slide track such that movement of the linear slide bearing is restricted in directions other than along a length of the linear slide track, wherein the linear slide bearing is defined to move freely along the length of the linear slide track in the direction parallel to the first rotational axis when engaged with the linear slide track.

18. A loadport as recited in claim 13, further comprising:
a cam roller support member disposed in a fixed position relative to the articulating arm, the cam roller support member defined to extend along the spiral cam in a direction parallel to the first rotational axis, the cam roller support member positioned in a spaced apart manner from the exterior surface of the spiral cam, wherein the cam roller is connected to the cam roller support member at a fixed distal position relative to the articulating arm.

19. A loadport as recited in claim 13, further comprising:
an arm carriage defined to move vertically, wherein the articulating arm is rotatably connected to the arm carriage about a second rotational axis oriented parallel to the first rotational axis.

20. A loadport as recited in claim 13, further comprising:
an isolation plate; and
a window defined within the isolation plate, wherein the articulating arm is defined to move within a vertical plane oriented perpendicular to the window through a combination of vertical movement of the arm carriage and rotation of the articulating arm about the second rotational axis, wherein both the first and second rotational axes extend perpendicular to the vertical plane within which the articulating arm is defined to move.

21. A method for operating a loadport to provide horizontal displacement of an object, comprising:
rigidly connecting a linear slide assembly to a rotatable shaft extending outward from an articulating arm of a loadport, the rotatable shaft having a rotational axis oriented in a horizontal direction;
placing a spiral cam having a tubular shaped portion defined by an interior cavity and an exterior surface over the linear slide assembly such that the linear slide assembly is received within the interior cavity of the spiral cam, wherein the interior cavity of the spiral cam interfaces with the linear slide assembly such that the spiral cam is freely movable along a length of the linear slide assembly and such that the spiral cam is prevented from rotating relative to the linear slide assembly, and wherein the exterior surface of the spiral cam includes a cam contour; and
placing a cam roller at a fixed position relative to the articulating arm and proximate to the exterior surface of the spiral cam such that the cam roller engages with the cam contour of the exterior surface of the spiral cam.

22. A method as recited in claim 21, further comprising:
rotating the spiral cam relative to the cam roller through rotation of the linear slide assembly by way of the rotatable shaft, whereby rotation of the spiral cam causes the cam contour of the exterior surface of the spiral cam to traverse along the cam roller and cause movement of the spiral cam in the horizontal direction.

23. A method as recited in claim 21, wherein the cam contour includes a translational segment and one or more dwell segments, wherein the translational segment is defined to cause movement of the spiral cam in the horizontal direction as the spiral cam is rotated relative to the cam roller, and wherein each of the one or more dwell segments is defined to maintain a steady position of the spiral cam in the horizontal direction as the spiral cam is rotated relative to the cam roller.

24. A method as recited in claim 23, wherein the cam contour includes one translational segment and two dwell segments with the one translational segment positioned between the two dwell segments, wherein the one translational segment and two dwell segments are connected in a continuous manner along the cam contour.

25. A method as recited in claim 23, wherein a size of the translational segment as measured in the horizontal direction defines a translational displacement of the spiral cam in the horizontal direction.

26. A method as recited in claim 21, further comprising:
rigidly connecting a gripper support to the exterior surface of the spiral cam at a position away from the cam contour, the gripper support defined to hold a gripper assembly that is defined to grasp the object.

27. A method as recited in claim 21, further comprising:
positioning the articulating arm at a first angular position and rotating the rotatable shaft to a first rotational position to allow the gripper assembly to grasp the object at a first location, wherein the first rotational position corresponds to engagement of the cam roller with a distal segment of the cam contour relative to the articulating arm;
actuating the gripper assembly to grasp the object;
moving the articulating arm to a second angular position so as to move the object to a second location;
rotating the rotatable shaft as the articulating arm is moved to the second angular position, wherein rotating the rotatable shaft causes the cam contour to move along the cam roller and correspondingly causes the spiral cam to move in the horizontal direction away from the articulating arm, such that the object is displaced in the horizontal direction between the first and second locations.

28. A method as recited in claim 27, wherein the rotatable shaft is rotated as the articulating arm is moved so as to maintain an attitudinal orientation of the object during movement of the object between the first and second locations.

29. A method as recited in claim 27, further comprising:
vertically moving the articulating arm simultaneously with moving the articulating arm to the second angular position so as to move the object through a window of the loadport.

* * * * *